United States Patent
Hsieh et al.

(10) Patent No.: US 10,833,233 B2
(45) Date of Patent: Nov. 10, 2020

(54) LIGHT-EMITTING DEVICE HAVING PACKAGE STRUCTURE WITH QUANTUM DOT MATERIAL AND MANUFACTURING METHOD THEREOF

(71) Applicant: EPISTAR CORPORATION, Hsinchu (TW)

(72) Inventors: Min-Hsun Hsieh, Hsinchu (TW); Tsung-Hong Lu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/280,465

(22) Filed: Feb. 20, 2019

(65) Prior Publication Data

US 2019/0259922 A1    Aug. 22, 2019

Related U.S. Application Data

(60) Provisional application No. 62/632,732, filed on Feb. 20, 2018.

(51) Int. Cl.
*H01L 33/60* (2010.01)
*H01L 33/50* (2010.01)
*H01L 33/62* (2010.01)

(52) U.S. Cl.
CPC .......... *H01L 33/60* (2013.01); *H01L 33/502* (2013.01); *H01L 33/505* (2013.01); *H01L 33/507* (2013.01); *H01L 33/62* (2013.01); *H01L 2933/0041* (2013.01); *H01L 2933/0058* (2013.01); *H01L 2933/0066* (2013.01);

(Continued)

(58) Field of Classification Search
CPC ..... H01L 33/505; H01L 33/507; H01L 33/60; H01L 33/52; H01L 33/54
See application file for complete search history.

(56) References Cited

U.S. PATENT DOCUMENTS 8,029,152 B2 * 10/2011 Sekine .................... H01L 33/60
    362/297
2008/0211386 A1 * 9/2008 Choi ..................... H01L 33/504
    313/503

(Continued)

OTHER PUBLICATIONS

Kimio Nagasaka et al., "Micro-bonding laser chips using arrayed beams," The International Society for Optics and Photonics, SPIE Newsroom, Jul. 24, 2008, DOI: 10.1117/2.1200807.1115, 2 pages.

*Primary Examiner* — Scott B Geyer
(74) *Attorney, Agent, or Firm* — Muncy, Geissler, Olds & Lowe, P.C.

(57) ABSTRACT

A light-emitting device includes a light-emitting unit, a light-transmitting layer, a wavelength conversion structure, and a reflective layer. The light-emitting unit includes a top surface and a first side surface. The light-transmitting layer covers the top surface and the first side surface of the light-emitting unit. The wavelength conversion structure is located on the light-transmitting layer. The wavelength conversion structure includes a wavelength conversion layer, a first barrier layer located on the wavelength conversion layer, a second barrier layer located under the wavelength conversion layer, and a third barrier layer covering side surfaces of the wavelength conversion layer, the first barrier layer, and the second barrier layer. The reflective layer surrounds the light-transmitting layer and the wavelength conversion structure.

19 Claims, 15 Drawing Sheets

(52) U.S. Cl.
CPC ............... *H01L 2933/0083* (2013.01); *H01L 2933/0091* (2013.01)

(56) References Cited

U.S. PATENT DOCUMENTS

| | | | |
|---|---|---|---|
| 2011/0303940 A1* | 12/2011 | Lee | H01L 33/54 |
| | | | 257/98 |
| 2015/0009453 A1 | 1/2015 | Cha et al. | |
| 2015/0091028 A1* | 4/2015 | Lee | G02B 6/0023 |
| | | | 257/89 |
| 2016/0104825 A1* | 4/2016 | Sato | H01L 33/505 |
| | | | 257/98 |
| 2017/0005245 A1* | 1/2017 | Hsu | H01L 33/60 |
| 2017/0250327 A1* | 8/2017 | Hsieh | H01L 33/486 |
| 2018/0138375 A1* | 5/2018 | Park | H01L 33/504 |
| 2018/0198031 A1* | 7/2018 | Kim | H01L 33/486 |
| 2018/0351052 A1* | 12/2018 | Yoo | C03C 27/06 |
| 2019/0088824 A1* | 3/2019 | Kim | H01L 33/56 |

* cited by examiner

LIGHT-EMITTING DEVICE HAVING PACKAGE STRUCTURE WITH QUANTUM DOT MATERIAL AND MANUFACTURING METHOD THEREOF

CROSS-REFERENCE TO RELATED APPLICATIONS

This application claims priority of U.S. Provisional Application No. 62/632,732 filed on Feb. 20, 2018 under 35 U.S.C. § 119(e), the entire contents of which are hereby incorporated by reference.

BACKGROUND OF THE INVENTION

Field of the Invention

The present disclosure relates to a light-emitting device, in particular a light-emitting device having a packaging structure with quantum dot material.

Brief Description of the Related Art

The light-emitting diodes (LEDs) have the characteristics of low power consumption, long operating life, low heat generation, small volume, long operating life, impact resistance, small size, and fast response so the LED is widely used in various fields where light-emitting components are required. For example, vehicles, home appliances, display screens, and lighting fixtures. The wavelength conversion material, such as phosphor, is a photoluminescent material and can absorb the first light from the LED and convert the first light to a second light with a different spectrum from the first light.

Recently, the demand for display image quality is increasing, and the development of wide color gamut technology has become one of the most important technological developments of displays. In general, if the fluorescent powder is used in the display, the NTSC is about 70~80%. If the quantum dot (QD) material is used in the display, the NTSC can be around 100%.

Quantum dot material is one kind of wavelength conversion material. Different particle sizes of quantum dot material can emit light with different wavelengths. In addition, the light converted by the quantum dot material can have a small Full Width at Half Maximum (FWHM). The light converted by the quantum dot material has a small Full Width at Half Maximum and is similar to a monochromatic light. Hence, the quantum dot material is suitable for being used in the display and the amount of light filtered by the color filter can be reduced.

SUMMARY OF THE INVENTION

The following description illustrates embodiments and together with drawings to provide a further understanding of the disclosure described above.

A light-emitting device includes a light-emitting unit, a light-transmitting layer, a wavelength conversion structure, and a reflective layer. The light-emitting unit includes a top surface and a first side surface. The light-transmitting layer covers the top surface and the first side surface of the light-emitting unit. The wavelength conversion structure is located on the light-transmitting layer. The wavelength conversion structure includes a wavelength conversion layer, a first barrier layer located on the wavelength conversion layer, a second barrier layer located under the wavelength conversion layer, and a third barrier layer covering side surfaces of the wavelength conversion layer, the first barrier layer, and the second barrier layer. The reflective layer surrounds the light-transmitting layer and the wavelength conversion structure.

DETAILED DESCRIPTION OF THE PREFERRED EMBODIMENTS

The drawings illustrate the embodiments of the application and, together with the description, serve to illustrate the principles of the application. The same name or the same reference number given or appeared in different paragraphs or figures along the specification should has the same or equivalent meanings while it is once defined anywhere of the disclosure. The thickness or the shape of an element in the specification can be expanded or narrowed.

Figure 1A:
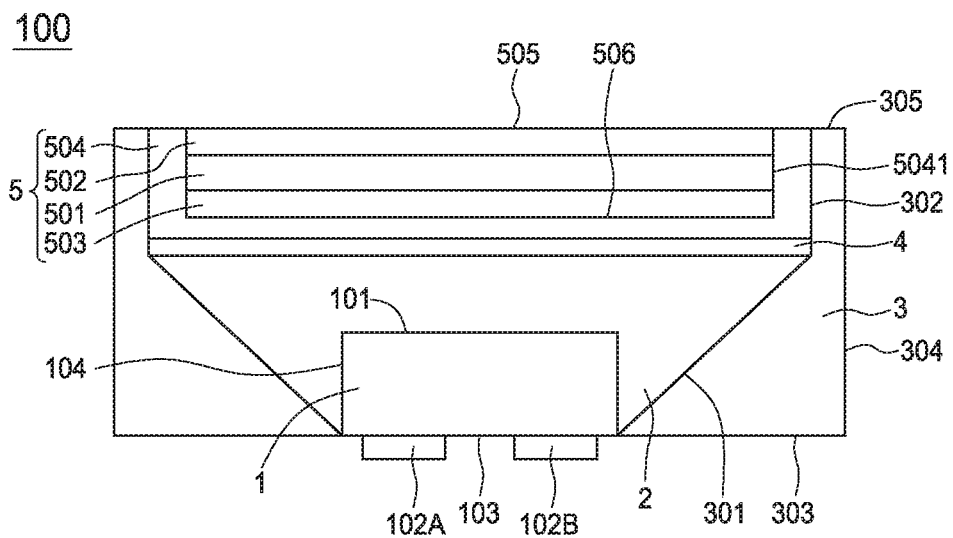
FIG. 1A shows a cross-sectional view of a light-emitting device in accordance with an embodiment of the present disclosure.

FIG. 1A is a cross-sectional view of a light-emitting device 100 in accordance with an embodiment of the present disclosure. The light-emitting device 100 includes a light-emitting unit 1, a light-transmitting layer 2, a reflective layer 3, a wavelength conversion structure 5, and an adhesive layer 4. The light-emitting unit 1 includes a top surface 101, two conductive electrodes 102A, 102B located on a bottom surface 103 opposite to the top surface 101, and a plurality of side surfaces 104. The light-emitting unit 1 can be a chip having a singular diode or a chip having a plurality of diodes for operation under high-voltage. The top surface 101 of the light-emitting unit 1 is a light-emitting surface. The outermost surface of the conductive electrodes 102A, 102B does not exceed the side surface 104 of the light-emitting unit 1. In other words, the outermost surface of the conductive electrodes 102A, 102B is coplanar with or shrunk from the side surface 104 of the light-emitting unit 1. The light-transmitting layer 2 surrounds the side surface 104 of the light-emitting unit 1 and covers the top surface 101. The wavelength conversion structure 5 is located above the light-transmitting layer 2 and is fixed to the light-transmitting layer 2 through the adhesive layer 4. In other words, the adhesive layer 4 is located between the wavelength conversion structure 5 and the light-transmitting layer 2, and the wavelength conversion structure 5 is distant from the top surface 101 of the light-emitting unit 1 by a distance greater than zero. The reflective layer 3 surrounds the light-transmitting layer 2, the light-emitting unit 1, the adhesive layer 4, and the wavelength conversion structure 5. The bottommost surface 303 of the reflective layer 3 is directly in contact with and substantially coplanar with the bottom surface 103 of the light-emitting unit 1. In other words, the bottom surface of the light-transmitting layer 2 is not visible from appearance. In another embodiment, the light-transmitting layer 2 covers at least a portion of the bottom surface 103 of the light-emitting unit 1. The inner surface of the reflective layer 3 includes a first portion 301 and a second portion 302 above the first portion 301. The first portion 301 is inclined to the bottommost surface 303 and directly covers the light-transmitting layer 2. Hence, the width of the light-transmitting layer 2 varies with the inclined surface of the first portion 301, and is gradually widened in a direction from the bottom surface 103 toward the top surface 101 of the light-emitting unit 1. The second portion 302 directly in contact with the adhesion layer 4 and the wavelength conversion structure 5, and is substantially perpendicular to the bottommost surface 303 of the reflective layer 3. The outermost surface 304 of the reflective layer 3 is substantially perpendicular to the bottommost surface 303. The topmost surface 305 of the reflective layer 3 is a flat surface which is substantially perpendicular to the outermost surface 304, and has a width that is not equal to and smaller than that of the bottommost surface 303. The topmost surface 305 of the reflective layer 3 is substantially coplanar with the topmost surface 505 of the wavelength conversion structure 5. In an embodiment, the topmost surface 305 of the reflective layer 3 is not a flat surface and has a recess or a protrusion. In another embodiment, the topmost surface 305 of the reflective layer 3 is not coplanar with the topmost surface 505 of the wavelength conversion structure 5 and can be higher or lower than the topmost surface 505 of the wavelength conversion structure 5.

The adhesive layer 4 and the top surface 101 of the light-emitting unit 1 have a distance greater than 0. Therefore, the light-transmitting layer 2 is located between the adhesive layer 4 and the top surface 101 of the light-emitting unit 1. The maximum width of the adhesive layer 4 is substantially equal to that of the wavelength conversion structure 5. In another embodiment, the maximum width of the adhesive layer 4 is greater than or smaller than that of the wavelength conversion structure 5. The thickness of the adhesive layer 4 can be thinner than that of the wavelength conversion structure 5. In an embodiment, the thickness of the adhesive layer 4 is less than 20 μm. The material of the adhesive layer 4 can be a thermosetting resin or a photo-curable resin, such as a silicone resin.

The wavelength conversion structure 5 has a wavelength conversion layer 501, a first barrier layer 502, a second barrier layer 503, and a third barrier layer 504. The first barrier layer 502 and the second barrier layer 503 can seal the top and bottom surfaces of the wavelength conversion layer 501, and the third barrier layer 504 can seal the side surface of the wavelength conversion layer 501. Therefore, the outer surfaces of the wavelength conversion layer 501 is protected by barrier layers and insulated from the water and oxygen come from outside, so as to improve the reliability of the wavelength conversion layer 501. The first barrier layer 502 directly covers the top surface of the wavelength conversion layer 501, the second barrier layer 503 directly covers the bottom surface of the wavelength conversion layer 501, and the wavelength conversion layer 501 is sandwiched in between the first barrier layer 502 and the second barrier layer 503. The side surfaces of the first barrier layer 502, the wavelength conversion layer 501, and the second barrier layer 503 can be substantially coplanar or be not coplanar (not shown). The third barrier layer 504 covers the first barrier layer 502, the wavelength conversion layer 501, the side surface of the second barrier layer 503, and the bottom surface 506 of the second barrier layer 503. Therefore, the wavelength conversion layer 501 is surrounded by the first barrier layer 502, the second barrier layer 503, and the third barrier layer 504. The second barrier layer 503 is sandwiched in between the wavelength conversion layer 501 and the third barrier layer 504. The first barrier layer 502, the wavelength conversion layer 501, and the second barrier layer 503 can have substantially the same width or different widths. The third barrier layer 504 has an inner side surface 5041 directly contacting the side surfaces of the first barrier layer 502, the wavelength conversion layer 501, and the second barrier layer 503. The inner surface 5041 is substantially perpendicular to the topmost surface 505 of the wavelength conversion structure 5 or contoured along the side surfaces of the first barrier layer 502, the wavelength conversion layer 501, and the second barrier layer 503.

The wavelength conversion layer 501 includes a quantum dot material containing a matrix and quantum dot particles dispersed in the matrix. The material of the matrix can be a thermosetting resin or a photo-curable resin, such as PMMA, epoxy resin, or silicone resin. The material of the quantum dot particles can be semiconductor material and has a particle diameter of less than or equal to 100 nm in general. The semiconductor material includes II-VI semiconductor compound, III-V semiconductor compound, IV-VI semiconductor compound, or combination of thereof. The structure of the quantum dot particles can include a core that used to emit light and a shell that used to cover the core. The material of the core can be ZnS, ZnSe, ZnTe, ZnO, $CsPbCl_3$, $CsPbBr_3$, $CsPbI_3$, CdS, CdSe, CdTe, GaN, GaP, GaSe, GaSb, GaAs, AlN, AlP, AlAs, InP, InAs, Te, PbS, InSb, PbTe, PbSe, SbTe, ZnCdSe, ZnCdSeS, or CuInS. The material of the shell has to match the material of the core, for example, the lattice constants of the core and shell need to match. The material of the shell is preferred to have the lattice constant matches with that of the core, and can also form a high energy barrier region on the periphery of the core to enhance the quantum yield. The structure of the shell can be a single layer, a multilayer, or a structure with a gradual material composition ratio. In one embodiment, the core is cadmium selenide and the shell is a single layer of zinc sulfide. In another embodiment, the core includes cadmium selenide; the shell includes an inner layer composed of cadmium and zinc, or composed of sulfur and selenium, and an outer layer composed of zinc sulfide. In another embodiment, the core includes cadmium selenide (CdSe). The shell includes an inner layer composed of cadmium sulfide (CdS), an outer layer composed of zinc sulfide (ZnS), and a compositional transition layer disposed between the inner layer and the outer layer. The compositional transition layer can be composed of $Zn_{0.25}Cd_{0.75}S/Zn_{0.5}Cd_{0.5}S/Zn_{0.75}Cd_{0.25}S$, for example. The material composition ratio of the compositional transition layer is between that of the inner layer and that of the outer layer. In one embodiment, the compositional transition layer is a layer composed of a mixture of the materials of the outer layer and the inner layer.

The wavelength conversion layer 501 can include a wavelength conversion material other than quantum dot particles. In one embodiment, the phosphor material can be mixed with the quantum dot particles in the matrix. For example, a phosphor material with fluoride which has the activation center of manganese tetravalent and emits red light is mixed with green quantum dot particles in a matrix. In another embodiment, other types of phosphor material and quantum dot particles are formed in layers in the matrix. For example, a green light-emitting oxynitride phosphor layer is formed near the light-emitting unit 1, and red quantum dot particles and/or other color quantum dot particles cover on the phosphor layer. The wavelength conversion layer 501 can also include light-scattering particles. In one embodiment, a plurality of light-scattering particles is dispersed in the matrix. The routes of the light from the light-emitting unit 1 and transmitting in the wavelength conversion layer 501 can be increased by scattered by the light-scattering particles. Therefore, the probability of that the light from the light-emitting unit 1 and absorbed by the quantum dot material/phosphor material is improved. The material of the light-scattering particles can include cerium oxide or titanium oxide particles.

The first barrier layer 502 and the second barrier layer 503 covering the top and bottom surfaces of the wavelength conversion layer 501 can have similar or the same materials, such as PVDF (polyvinylidene difluoride) or PET (polyethylene terephthalate). The heat deflection temperature (HDT) of PVDF is higher than PET and is about 200° C. In addition, the light transmittance of PVDF is greater than 92.5%. In an embodiment, the first barrier layer 502 and the second barrier layer 503 include PVDF. During a reflowing step of the manufacturing process, the material properties of the first barrier layer 502 and the second barrier layer 503 are less destroyed due to high temperature. After reflowing step, the wavelength conversion layer 501 still has sufficient resistance to moisture and oxygen. The third barrier layer 504 can include a metal or an inorganic material. The metal can be Au, Al, Pt, Ni. The inorganic material can be $SiO_x$, $Al_2O_3$, SiON, or $SiN_x$.

The light-transmitting layer 2 can be silicone, epoxy, PI, BCB, PFCB, SUB, acrylic resin, PMMA, PET, PC, polyetherimide, fluorocarbon polymer, $Al_2O_3$, SINR, SOG. The material of the conductive electrodes 102A, 102B can be a metal such as Au, Ag, Cu, Cr, Al, Pt, Ni, Ti, Sn, an alloy thereof, or a combination thereof.

The light-transmitting layer 2 does not contain wavelength conversion material. In another embodiment, the light-transmitting layer 2 can include wavelength conversion material with a different emission wavelength or/and different density than those of the wavelength conversion layer 501. For example, the light-transmitting layer 2 includes red phosphor, and the wavelength conversion layer 501 includes green quantum dot particles.

The reflective layer 3 can be a mixture of a matrix and a high reflectivity material. The matrix can be a silicone-based or epoxy-based resin. The high reflectivity material can include titanium dioxide, Silicon dioxide, aluminum oxide, $K_2TiO_3$, $ZrO_2$, ZnS, ZnO, or MgO.

The light-emitting unit 1 is a semiconductor light-emitting element which can emit the non-coherent/coherent light and includes a substrate, a first-type semiconductor layer, an active stack, and a second-type semiconductor layer. The first-type semiconductor layer and the second-type semiconductor layer can be cladding layer or confinement layer and provide electrons and holes respectively. The electrons and holes are recombined in the active stack to emit light. The first-type semiconductor layer, the active stack, and the second-type semiconductor layer can include a semiconductor material of III-V group, such as $Al_xIn_yGa_{(1-x-y)}N$ or $Al_xIn_yGa_{(1-x-y)}P$, where $0 \leq x \leq 1$; $(x+y) \leq 1$. Based on the material of the active stack, the light-emitting unit 1 can emit a red light with a peak wavelength or dominant wavelength between 610 nm~650 nm, a green light having a peak wavelength or dominant wavelength between 530 nm~570 nm, a blue light having a peak wavelength or dominant wavelength between 450 nm~490 nm, a violet light having a peak wavelength or dominant wavelength between 400~450 nm, or a ultra-violet light having a peak wavelength or dominant wavelength between 280~400 nm. The substrate can be a growth substrate for epitaxially growing the first-type semiconductor layer, the active stack, and the second-type semiconductor layer in sequence thereon; or be a carrier for the first-type semiconductor layer, the active stack, and the second-type semiconductor layer in sequence located thereon after removing the growth substrate. The substrate can be made of a material, such as Ge, GaAs, InP, sapphire, SiC, Si, $LiAlO_2$, ZnO, GaN, AlN, metal, glass, composite, diamond, CVD diamond, Diamond-Like Carbon (DLC).

The wavelength conversion structure 5 is distant from the light-emitting unit 1 by a distance greater than 0, and the light-transmitting layer 2 is located between the wavelength conversion structure 5 and the light-emitting unit 1. The wavelength conversion structure 5 is not directly in contact with the light-emitting unit 1, and the heat produced by the light-emitting unit 1 is not directly transmitted to the wavelength conversion structure 5. Therefore, the reliability of the wavelength conversion structure 5 is less affected by the rising temperature due to the directly thermal conduction from the light-emitting unit 1. A portion of the light is the absorbed/converted light which is emitted from the light-emitting unit 1 to the wavelength conversion structure 5 and is absorbed/converted by the wavelength conversion material in the wavelength conversion structure 5. Another portion of the light is non-absorbed/non-converted light which is emitted from the light-emitting unit 1 to the wavelength conversion structure 5 and is not absorbed/converted by the wavelength conversion material in the wavelength conversion structure 5. The absorbed/converted light and the non-absorbed/non-converted light are completely or partially mixed and exit the light-emitting device 100.

Figure 1B:
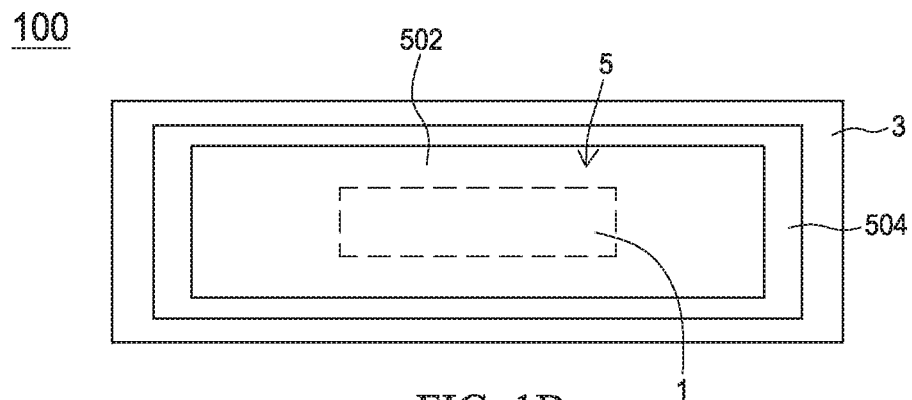
FIG. 1B shows a top view of a light-emitting device in accordance with an embodiment of the present disclosure.

FIG. 1B is a top view of a light-emitting device 100 in accordance with an embodiment of the present disclosure. The wavelength conversion structure 5 covers and locates on the light-emitting unit 1, and the reflective layer 3 surrounds the outer surfaces wavelength conversion structure 5. In detail, the reflective layer 3 surrounds the third barrier layer 504, and the third barrier layer 504 surrounds the periphery of the first barrier layer 502. In the top view, the geometric centers of the reflective layer 3, the third barrier layer 504, and the first barrier layer 502 locate at the similar position. FIG. 1B shows that the light-emitting device 100 has a rectangular shape which is not a limitation of the present disclosure. In other embodiments, the light-emitting device 100 can be other non-rectangular shapes, such as triangle, trapezoid, rhombus, parallelogram, square, circular, or other polygons. When the wavelength conversion material in the wavelength conversion structure 5 is excited by the light from the light-emitting unit 1, the thermal energy is also produced by the wavelength conversion material so the temperature of the wavelength conversion structure 5 is increased and the reliability of the wavelength conversion structure 5 is decreased. In one embodiment, the quantum dot particle existed in the wavelength conversion structure 5 can withstand a light energy density of approximately 0.2 W/mm$^2$. If the intensity of the incident light is too strong, the characteristics of the quantum dot particles, such as luminous efficiency and luminous intensity, may be deteriorated. Therefore, in order to reduce thermal energy generated by the wavelength conversion material caused by wavelength conversion, the area of the wavelength conversion structure 5 is larger than the light-emitting surface of the light-emitting unit 1 for reducing the light energy density the wavelength conversion structure 5 can withstand. From the top view, the top surface of the light-emitting unit 1 has an area A1, and the top surface of the wavelength conversion structure 5 has an area A2, wherein A2>A1, and A2/A1 is in a certain range of values, for example, 1.5<A2/A1<10.

Figure 1C:
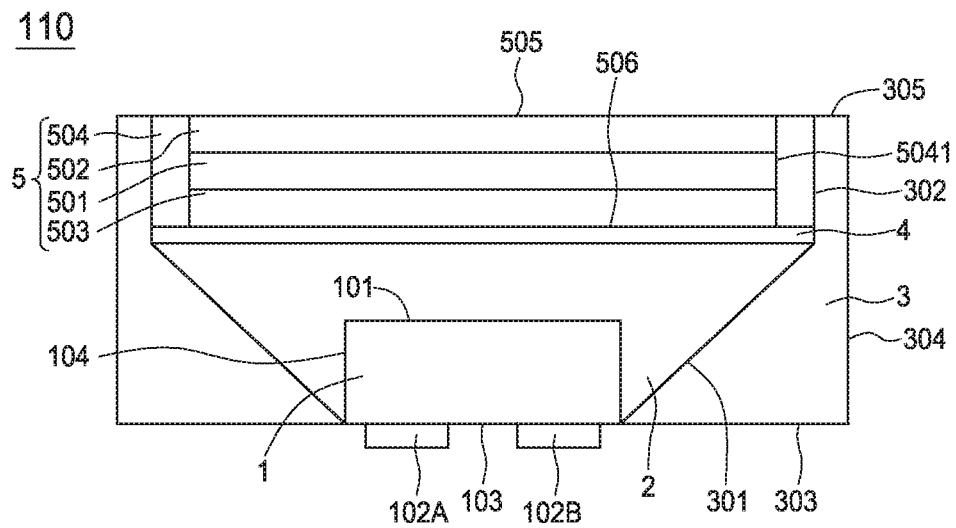
FIG. 1C shows a cross-sectional view of a light-emitting device in accordance with another embodiment of the present disclosure.

The third barrier layer 504 can seal the side surfaces of the wavelength conversion layer 501, so the third barrier layer 504 can alternatively only cover the side surfaces of the first barrier layer 502, the wavelength conversion layer 501, and the second barrier layer 503. The bottom surface 506 of the second barrier layer 503 is not covered by the third barrier layer 504, as shown in FIG. 1C. FIG. 1C is a cross-sectional view of a light-emitting device 110 in accordance to an embodiment of the present disclosure. The light-emitting device 110 includes a light-emitting unit 1, a light-transmitting layer 2, a reflective layer 3, a wavelength conversion structure 5, and an adhesive layer 4. The wavelength conversion structure 5 includes a wavelength conversion layer 501, a first barrier layer 502, a second barrier layer 503, and a third barrier layer 504. The first barrier layer 502 directly covers the top surface of the wavelength conversion layer 501, and the second barrier layer 503 directly covers the bottom surface of the wavelength conversion layer 501. The side surfaces of the first barrier layer 502, the wavelength conversion layer 501, and the second barrier layer 503 are substantially coplanar or not coplanar. The wavelength conversion layer 501 is located between the first barrier layer 502 and the second barrier layer 503. The third barrier layer 504 covers the side surfaces of the first barrier layer 502, the wavelength conversion layer 501, and the second barrier layer 503. The bottom surface 506 of the second barrier layer 503 is not covered by the third barrier layer 504 and is directly in contact with the adhesive layer 4. The details of structure and material of the light-emitting unit 1, the light-transmitting layer 2, the reflective layer 3, the wavelength conversion structure 5, and the adhesive layer 4 can be referred to that of the aforementioned light-emitting device 100.

Figure 2A:
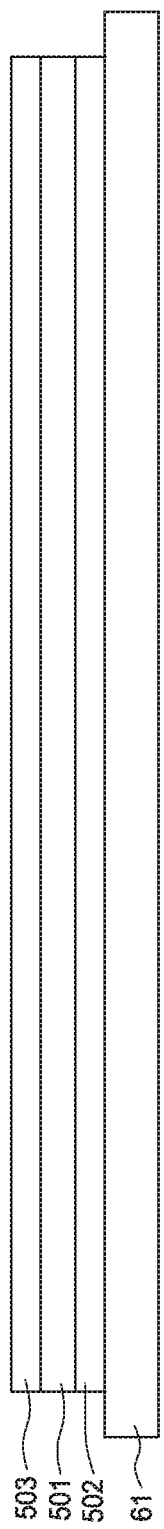
FIGS. 2A~2F show steps of manufacturing a wavelength conversion structure in accordance with an embodiment of the present disclosure.
Figure 2B:
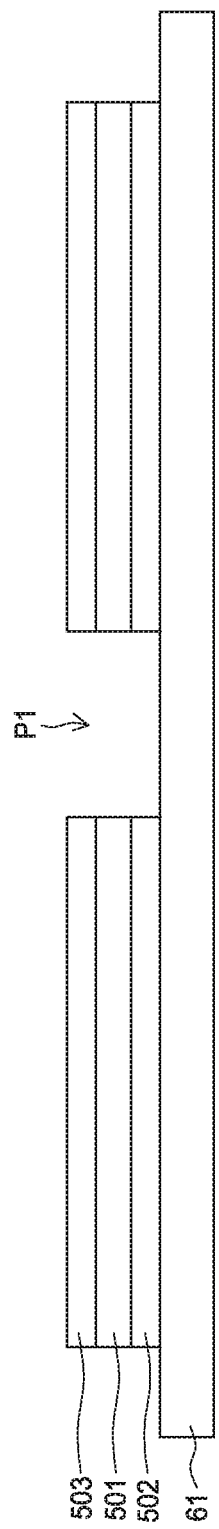
Figure 2C:
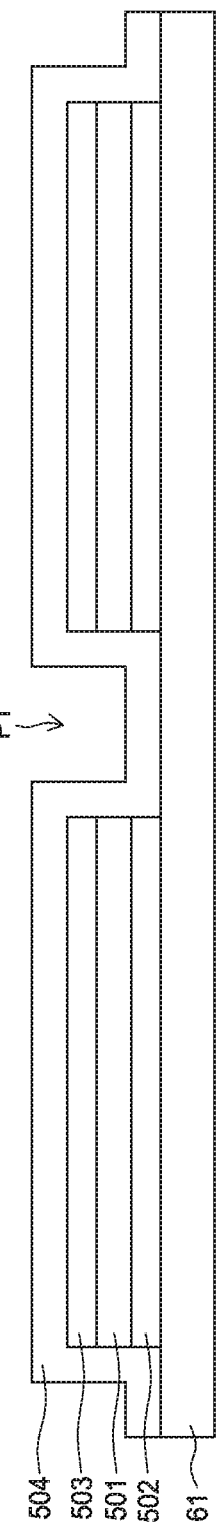
Figure 2D:
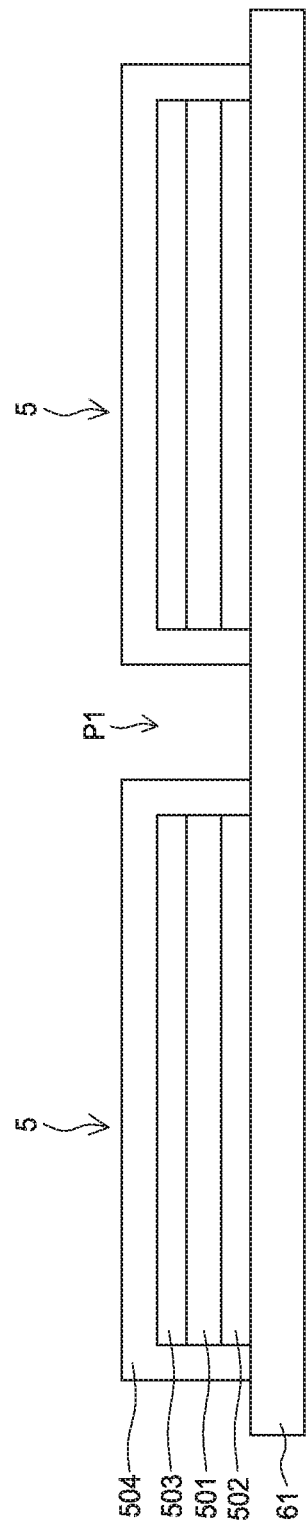
Figure 2E:
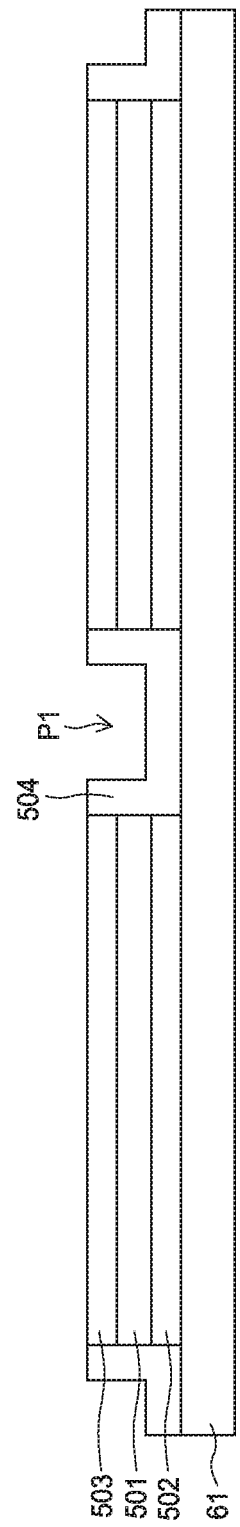
Figure 2F:
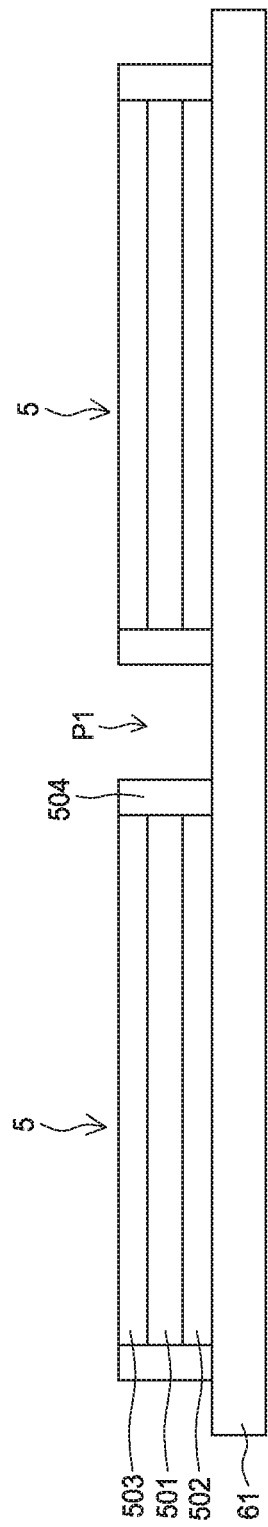

FIGS. 2A~2F show the steps of manufacturing a wavelength conversion structure in accordance with an embodiment of the present disclosure. Referring to FIG. 2A, a wavelength conversion layer 501 having a first barrier layer 502 and a second barrier layer 503 is disposed on the first temporary carrier 61, wherein the first barrier layer 502 is directly in contact with the first temporary carrier 61 or adhered to the first temporary carrier 61 by an adhesive layer (not shown). Next, referring to FIG. 2B, a plurality of aisles P1 is formed by cutting and defines the sizes of the plurality of wavelength conversion structures. Referring to FIG. 2C, the third barrier layer 504 covers the sides of the first barrier layer 502, the wavelength conversion layer 501, and the second barrier layer 503, and the upper surface of the second barrier layer 503, and fills in the aisle P1 by printing, coating, spraying, dispensing, or molding. Finally, referring to FIG. 2D, the third barrier layer 504 in the aisle P1 is removed, and a plurality of wavelength conversion structures 5 is formed on the first temporary carrier 61. In another embodiment, the step of FIG. 2C is replaced by FIG. 2E, and the third barrier layer 504 only covers the sides of the first barrier layer 502, the wavelength conversion layer 501, and the second barrier layer 503, and fills in the aisle P1. The top surface of the second barrier layer 503 is not covered by the third barrier layer 504. Finally, as shown in FIG. 2F, the third barrier layer 504 in the aisle P1 is removed, and a plurality of wavelength conversion structures 5 is formed on the first temporary carrier 61. The material of the first temporary carrier 61 can be a thermal release tape, a UV tape, a chemical release tape, a heat resistant tape, or a blue tape.

Figure 3A:
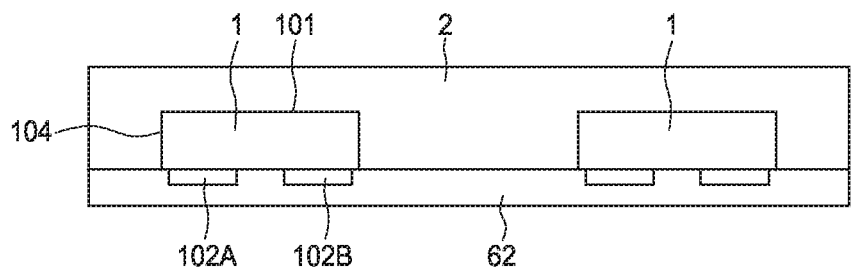
FIGS. 3A~3F show steps of manufacturing a light-emitting device in accordance with an embodiment of the present disclosure.
Figure 3B:
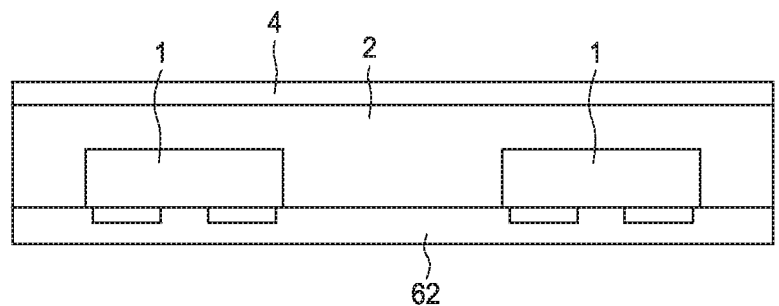
Figure 3C:
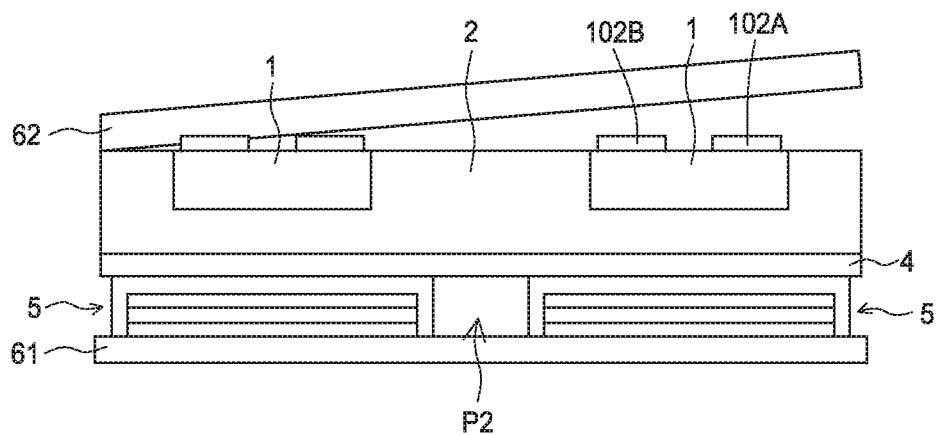
Figure 3D:
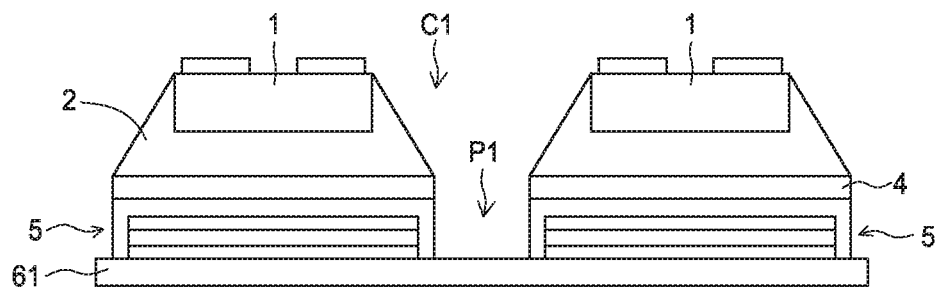
Figure 3E:
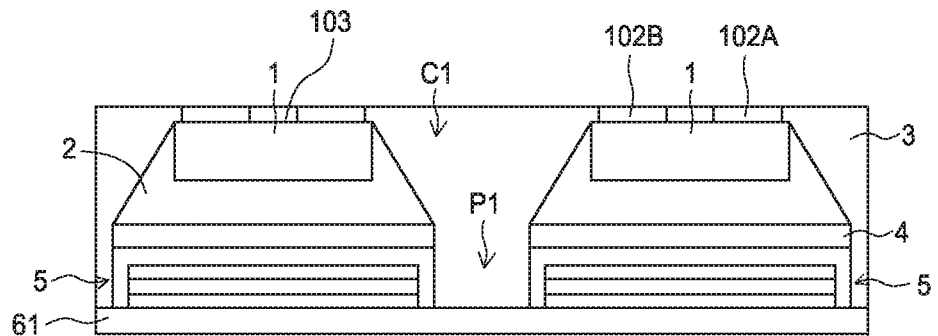
Figure 3F:
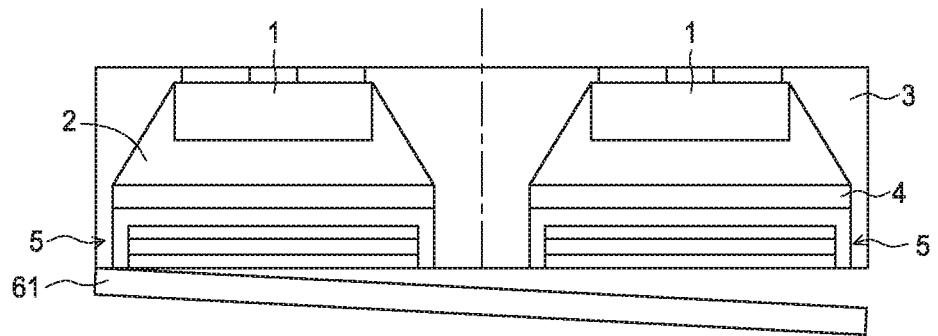

FIGS. 3A~3F show the steps of manufacturing a light-emitting device in accordance with an embodiment of the present disclosure. Here, the manufacturing steps only take the light-emitting device 100 as exemplary here. To make the light-emitting device 110, only the wavelength conversion structure 5 needs to be replaced with the structure disclosed in FIG. 2F, and follows the same steps as described in FIGS. 3A~3F. Referring to FIG. 3A, a second temporary carrier 62 with adhesion is provided, and two conductive electrodes 102A, 102B of the plurality of light-emitting units 1 are disposed on the second temporary carrier 62. The area between adjacent light-emitting units 1 is defined as an aisle, the light-transmitting layer 2 covers the top surface 101 of the light-emitting unit 1 and fills in the aisle by printing, coating, spraying, dispensing, or molding. A planarization process, such as a polish process or blasting process, may be optionally performed to flatten the top surface of the light-transmitting layer 2. Subsequently, referring to FIG. 3B, an adhesive layer 4 is formed on the light-transmitting layer 2. Referring to FIG. 3C, the structure of FIG. 3B is inverted to align the light-emitting unit 1 with the wavelength conversion structure 5 of FIG. 2D. The wavelength conversion structure 5 of FIG. 2D is in contact with the adhesive layer 4 to fix the wavelength conversion structure 5 under each of the light-emitting units 1. The second temporary carrier 62 is removed to expose the conductive electrodes 102A, 102B. Next, referring to FIG. 3D, the light-transmitting layer 2 and the adhesive layer 4 are diced to form a cutting track C1 that has the upper portion which is wider and the lower portion which is narrower in the cross-sectional view, and to expose the aisle P1 between the adjacent wavelength conversion structures 5. In order to form the cutting track C1 that has the upper portion which is wider and the lower portion which is narrower in the cross-sectional view, it is preferable to use a blade having a similar outer shape to perform the cutting step. However, other cutting tools or the manufacturing processes which can form cutting track C1 with above shape are not excluded in this application. Referring to FIG. 3E, reflective layer 3 is formed in the area between the cutting track C1 and the aisle P1 by printing, coating, spraying, dispensing, or molding. Subsequently, a planarization process, such as a polish process or blasting process, is performed to expose the conductive electrodes 102A, 102B. At this step, the reflective layer 3 can alternatively cover the bottom surface 103 of the light-emitting unit 1 and filled between the conductive electrodes 102A, 102B. Finally, referring to FIG. 3F, the reflective layer 3 is diced and the first temporary carrier 61 is removed to form a plurality of light-emitting device. The method of removing the first temporary carrier 61 and the second temporary carrier 62 may be laser lift-off, heating separation, dissolution, or the like.

Figure 4A:
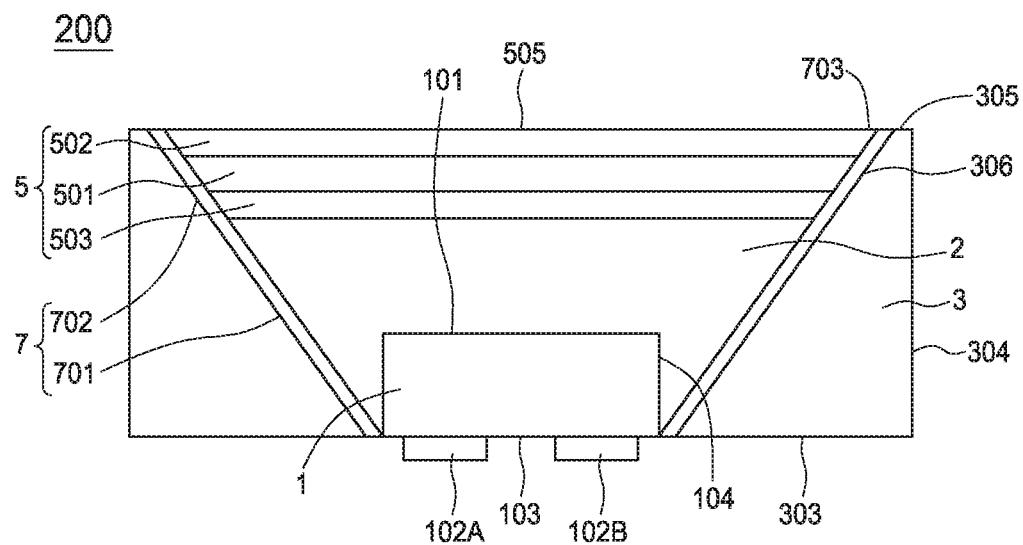
FIG. 4A shows a cross-sectional view of a light-emitting device in accordance with an embodiment of the present disclosure.

FIG. 4A is a cross-sectional view of a light-emitting device 200 in accordance with an embodiment of the present disclosure. The light-emitting device 200 includes a light-emitting unit 1, a light-transmitting layer 2, a reflective layer 3, a wavelength conversion structure 5, and a protective layer 7. The light-emitting unit 1 has a top surface 101, two conductive electrodes 102A, 102B located on the bottom surface 103 opposite to the top surface 101 of the light-emitting unit 1, and a plurality of side surfaces 104. The light-emitting unit 1 can be a chip having a singular diode or a chip having a plurality of diodes for operation under high-voltage. The top surface 101 of the light-emitting unit 1 is a light-emitting surface. The outermost surface of the conductive electrodes 102A, 102B does not exceed the side surface 104 of the light-emitting unit 1. In other words, the outermost surface of the conductive electrodes 102A, 102B is coplanar with or shrunk from the side surface 104 of the light-emitting unit 1. The light-transmitting layer 2 surrounds the side surface 104 of the light-emitting unit 1 and covers the top surface 101. The wavelength conversion structure 5 is located above the light-transmitting layer 2 and directly in contact with the light-transmitting layer 2. The wavelength conversion structure 5 is distant from the top surface 101 of the light-emitting unit 1 by a distance greater than zero. In another embodiment, similar to the light-emitting device 100, an adhesive layer (not shown) is between the wavelength conversion structure 5 and the light-transmitting layer 2. The reflective layer 3 surrounds the light-transmitting layer 2, the light-emitting unit 1, and the wavelength conversion structure 5. The bottommost surface 303 of the reflective layer 3 is directly in contact with and substantially coplanar with the bottom surface 103 of the light-emitting unit 1. In other words, the bottom surface of the light-transmitting layer 2 is not visible from appearance. In another embodiment, the light-transmitting layer 2 covers at least a portion of the bottom surface 103 of the light-emitting unit 1. The inner surface 306 of the reflective layer 3 is an inclined surface which is inclined to the bottommost surface 303 of the reflective layer 3. The outermost surface 304 of the reflective layer 3 is substantially perpendicular to the bottommost surface 303.

The protective layer 7 is formed on the inner surface 306 of the reflective layer 3, has a thickness, for example, larger than 10 μm and smaller than 50 μm, and has an acute angle with respect to the topmost surface 505 of the wavelength conversion structure 5. The protective layer 7 includes a first portion 701 and a second portion 702 located above the first portion 701. The first portion 701 is located between the light-transmitting layer 2 and the reflective layer 3 and directly covers the side surface of the light-transmitting layer 2. The second portion 702 is located between the wavelength conversion structure 5 and the light-transmitting layer 2 and directly covers the side surface of the wavelength conversion structure 5. The protective layer 7 can include metal or inorganic material. The metal can be Au, Al, Pt, Ni. The inorganic material can include $SiO_X$, $Al_2O_3$, SiON or $SiN_X$.

The wavelength conversion structure 5 has a wavelength conversion layer 501, a first barrier layer 502, and a second barrier layer 503. The first barrier layer 502 directly covers the top surface of the wavelength conversion layer 501, the second barrier layer 503 directly covers the bottom surface of the wavelength conversion layer 501, and the wavelength conversion layer 501 is located between the first barrier layer 502 and the second barrier layer 503. The side surfaces of the wavelength conversion layer 501, the first barrier layer 502, and the second barrier layer 503 collectively form an inclined surface which is directly covered by the second portion 702 of the protective layer 7. The first barrier layer 502 and the second barrier layer 503 can seal the top and bottom surfaces of the wavelength conversion layer 501. The protective layer 7 can seal the side surface of the wavelength conversion layer 501. Hence, the outer surfaces of the wavelength conversion layer 501 are protected by the barrier layer and the protective layer for isolating the external moisture and oxygen and improving the reliability of the wavelength conversion layer 501. The first barrier layer 502, the wavelength conversion layer 501, and the second barrier layer 503 collectively form a trapezoid that has the upper portion which is wider and the lower portion which is narrower in the cross-sectional view. In detail, the width of the second barrier layer 503 is smaller than that of the wavelength conversion layer 501, and the width of the wavelength conversion layer 501 is smaller than that of the first barrier layer 502. The topmost surface 505 of the wavelength conversion structure 5 is substantially coplanar with the topmost surface 305 of the reflective layer 3 and the topmost surface 703 of the protective layer 7.

The details of the material of the light-emitting unit 1, the light-transmitting layer 2, the reflective layer 3, the first barrier layer 502, the wavelength conversion layer 501, and the second barrier layer 503 can be referred to the descriptions of the aforementioned paragraphs of light-emitting device 100 and are not repeated here.

Figure 4B:
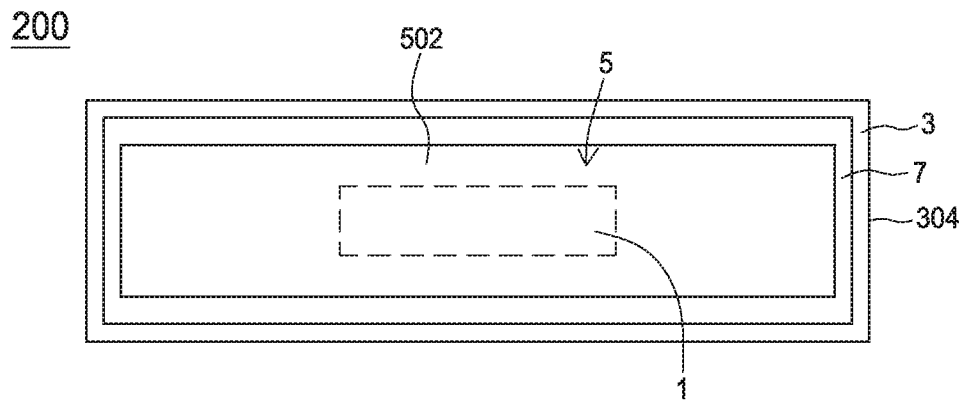
FIG. 4B shows a top view of a light-emitting device in accordance with an embodiment of the present disclosure.

FIG. 4B is a top view of a light-emitting device 200 in accordance with an embodiment of the present disclosure. The wavelength conversion structure 5 covers and locates on the light-emitting unit 1, the protective layer 7 surrounds the wavelength conversion structure 5, and the reflective layer 3 surrounds the protective layer 7 (as shown in FIG. 4A). FIG. 4B shows that the light-emitting device 200 has a rectangular shape which is not a limitation of the present disclosure. The light-emitting device 200 can be non-rectangular shapes, such as triangle, trapezoid, rhombus, parallelogram, square, circular, or other polygonal shapes. When the wavelength conversion material in the wavelength conversion structure 5 is excited by the light from the light-emitting unit 1, the thermal energy is also produced by the wavelength conversion material so the temperature of the wavelength conversion structure 5 is increased and the reliability of the wavelength conversion structure 5 is decreased. In one embodiment, the quantum dot particle existed in the wavelength conversion structure 5 can withstand a light energy density of approximately 0.2 $W/mm^2$. If the intensity of the incident light is too strong, the characteristics of the quantum dot particles, such as luminous efficiency and luminous intensity, may be deteriorated. Therefore, in order to reduce thermal energy generated by the wavelength conversion material due to wavelength conversion, the area of the wavelength conversion structure 5 is larger than the light-emitting surface of the light-emitting unit 1 for reducing the light energy density the wavelength conversion structure 5 can withstand. From the top view, the top surface of the light-emitting unit 1 has an area A1, and the top surface of the wavelength conversion structure 5 has an area A2, wherein A2>A1, and A2/A1 is in a certain range of values, for example, 1.5<A2/A1<10.

Figure 5A:
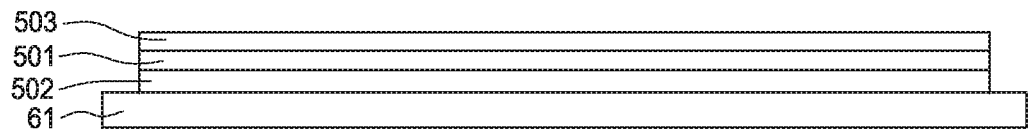
FIGS. 5A~5I show steps of manufacturing a light-emitting device in accordance with an embodiment of the present disclosure.
Figure 5B:
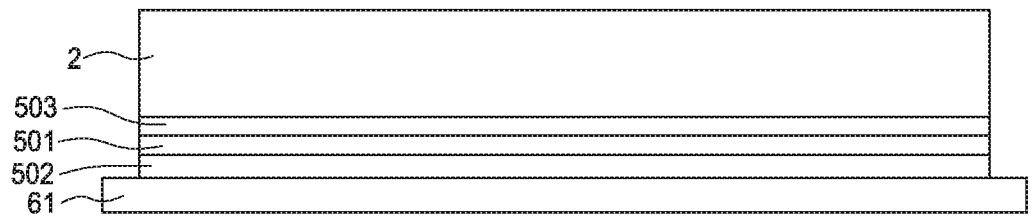
Figure 5C:
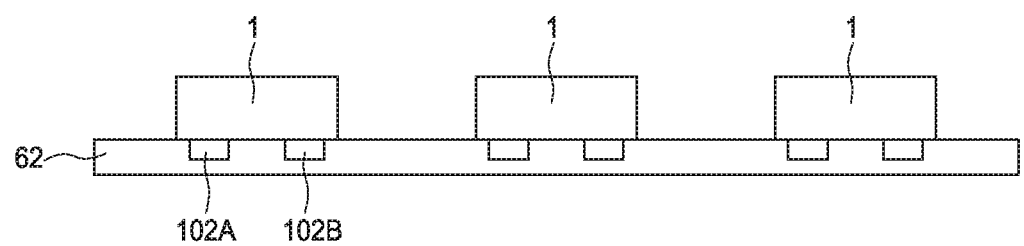
Figure 5D:
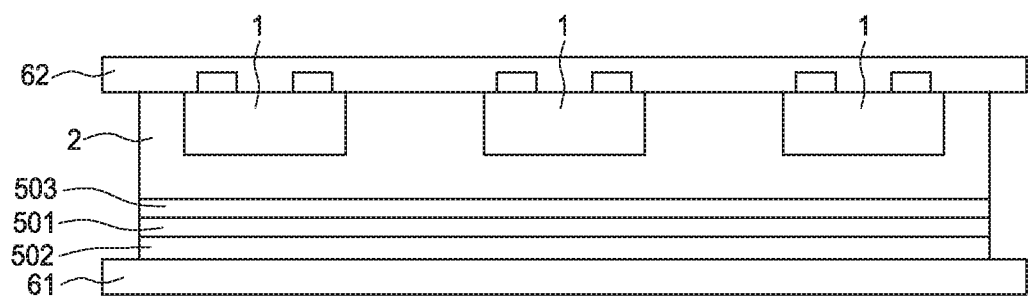
Figure 5E:
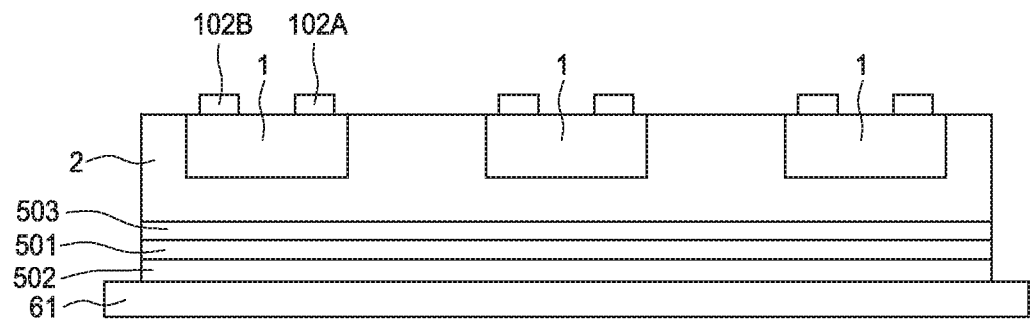
Figure 5F:
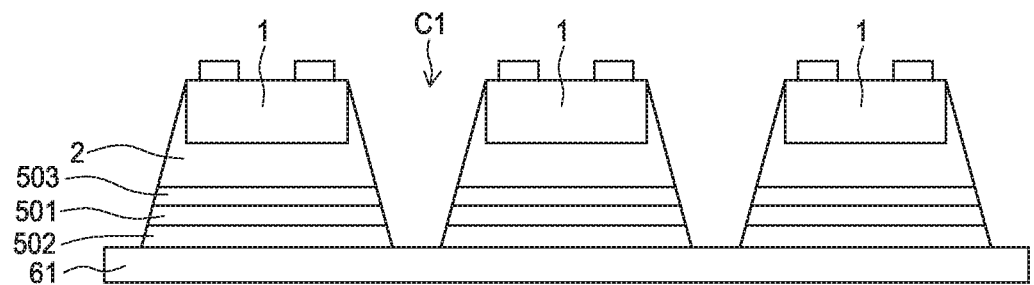
Figure 5G:
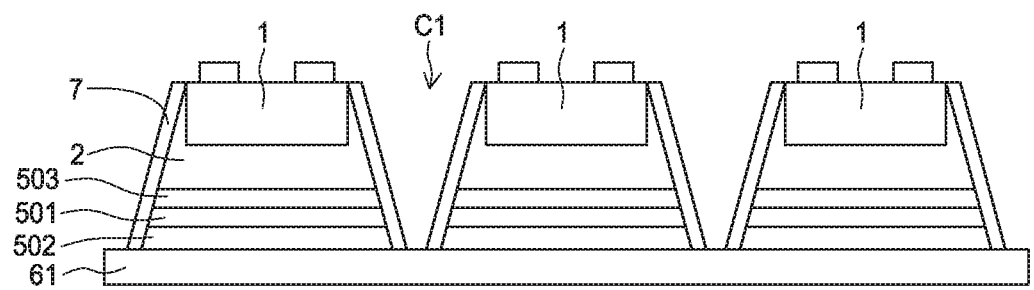
Figure 5H:
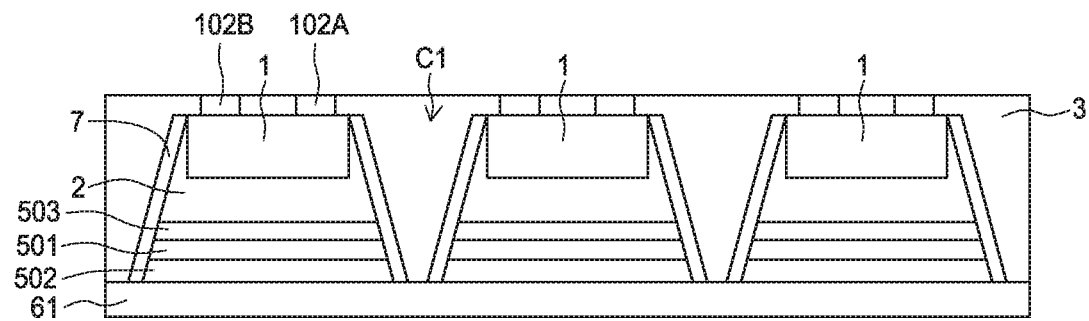
Figure 5I:
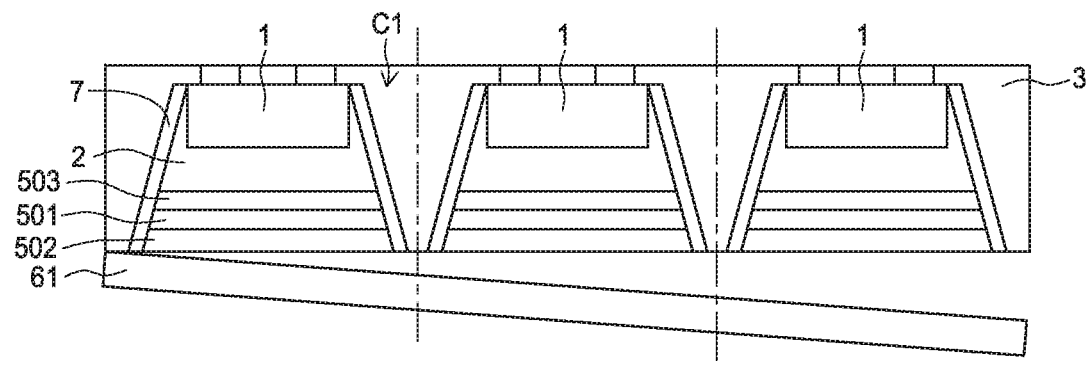

FIGS. 5A~5I show the steps of manufacturing a light-emitting device in accordance with an embodiment of the present disclosure. As shown in FIG. 5A, the wavelength conversion layer 501 having the first barrier layer 502 and the second barrier layer 503 is disposed on the first temporary carrier 61. The first barrier layer 502 is directly in contact with the first temporary carrier 61 or adhered to the first temporary carrier 61 by an adhesive layer (not shown). Next, as shown in FIG. 5B, the light-transmitting layer 2 is formed on the second barrier layer 503 by printing, coating, spraying, dispensing, or molding. Referring to FIG. 5C, a second temporary carrier 62 with adhesion is provided, and two conductive electrodes 102A, 102B of the plurality of light-emitting units 1 are disposed on the second temporary carrier 62. The area between adjacent light-emitting units 1 is defined as an aisle. Referring to FIG. 5D, the structure of FIG. 5C is inverted, and the light-emitting unit 1 is buried in the light-transmitting layer 2 of FIG. 5B such that the light-emitting unit 1 does not contact the second barrier layer 503. Referring to FIG. 5E, the second temporary carrier 62 is removed to expose the conductive electrodes 102A, 102B. Next, referring to FIG. 5F, the light-transmitting layer 2, the first barrier layer 502, the wavelength conversion layer 501, and the second barrier layer 503 are diced to form a cutting track C1 that has the upper portion which is wider and the lower portion which is narrower in the cross-sectional view. In order to form the cutting track C1 that has the upper portion which is wider and the lower portion which is narrower in the cross-sectional view, it is preferable to use a blade having a similar outer shape to perform the cutting step. However, other cutting tools or the manufacturing processes which can form cutting track C1 with above shape are not excluded in this application. Referring to FIG. 5G, in the cutting track C1, the protective layer 7 is formed on the inclined surface composed of the transparent layer 2, the first barrier layer 502, the wavelength conversion layer 501, and the second barrier layer 503 by atomic layer chemical vapor deposition (ALD), electroplating, or chemical plating. Subsequently, referring to FIG. 5H, reflective layer 3 is formed in the area between the cutting track C1 and the aisle P1 by printing, coating, spraying, dispensing, or molding. Subsequently, a planarization process, such as a polish process or blasting process, is performed to expose the conductive electrodes 102A, 102B. At this step, the reflective layer 3 can alternatively cover the bottom surface 103 of the light-emitting unit 1 and filled between the conductive electrodes 102A, 102B. Finally, referring to FIG. 5I, the reflective layer 3 is diced and the first temporary carrier 61 is removed to form a plurality of light-emitting device.

Figure 6A:
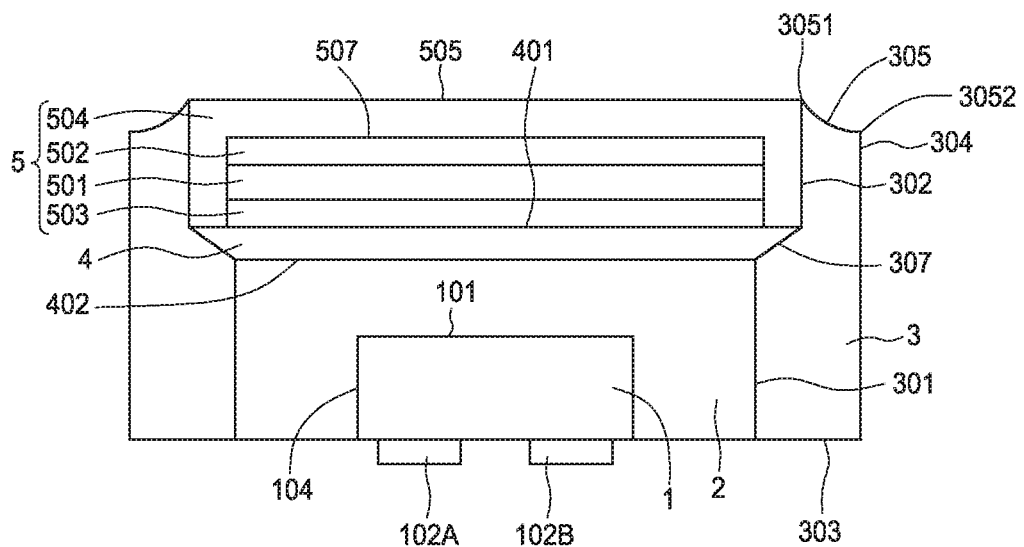
FIG. 6A shows a cross-sectional view of a light-emitting device in accordance with an embodiment of the present disclosure.

FIG. 6A is a cross-sectional view of a light-emitting device 300 in accordance with an embodiment of the present disclosure. The light-emitting element 300 includes a light-emitting unit 1, a light-transmitting layer 2, a reflective layer 3, a wavelength conversion structure 5, and an adhesive layer 4. The light-emitting unit 1 includes a top surface 101, two conductive electrodes 102A, 102B are located on a bottom surface 103 opposite to the top surface 101 of the light-emitting unit 1, and a plurality of side surfaces 104. The light-transmitting layer 2 surrounds the side surface 104 of the light-emitting unit 1 and covers the top surface 101. The wavelength conversion structure 5 is located above the light-transmitting layer 2 and is fixed to the light-transmitting layer 2 through the adhesive layer 4. In other words, the adhesive layer 4 is located between the wavelength conversion structure 5 and the light-transmitting layer 2, and the wavelength conversion structure 5 is distant from the top surface 101 of the light-emitting unit 1 by a distance greater than zero. The reflective layer 3 surrounds the light-transmitting layer 2, the light-emitting unit 1, the adhesive layer 4, and the wavelength conversion structure 5. The inner surface of the reflective layer 3 includes a first portion 301, a second portion 302 above the first portion 301, and a third portion 307 connecting the first portion 301 and the second portion 302. The first portion 301 is perpendicular to the bottommost surface 303 and directly covers the light-transmitting layer 2. The second portion 302 directly contacts the wavelength conversion structure 5 and is substantially perpendicular to the bottommost surface 303 of the reflective layer 3. The third portion 307 is located between the first portion 301 and the second portion 302, has an inclined surface, and is not parallel with the first portion 301 and the second portion 302. In another embodiment, the third portion 307 is a curved surface. The outermost surface 304 of the reflective layer 3 is substantially perpendicular to the bottommost surface 303. The distance between the first portion 301 of the inner surface of the reflective layer 3 and the outermost surface 304 is larger than the distance between the second portion 302 of the inner surface of the reflective layer 3 and the outermost surface 304. In other words, the width of the portion of the reflective layer 3 surrounding the light-transmitting layer 2 is wider than the portion of the reflective layer 3 surrounding the wavelength conversion structure 5. The topmost surface 305 of the reflective layer 3 is not a flat surface and has a recess. The end 3051 of the topmost surface 305 contacting with the wavelength conversion structure 5 is higher than the end 3052 where the topmost surface 305 intersects the outermost surface 304. In another embodiment, the topmost surface 305 of the reflective layer 3 is an inclined surface or a flat surface. When the topmost surface 305 of the reflective layer 3 is a flat surface, the topmost surface 305 of the reflective layer 3 and the topmost surface 505 of the wavelength conversion structure 5 are coplanar. In another embodiment, the end 3051 where the topmost surface 305 contacts the wavelength conversion structure is not in contact with the topmost surface 505 of the wavelength conversion structure 5, and lower than the topmost surface 505 of the wavelength conversion structure 5.

The adhesive layer 4 and the top surface 101 of the light-emitting unit 1 have a distance greater than 0, and the light-transmitting layer 2 is located between the adhesive layer 4 and the top surface 101 of the light-emitting unit 1. The width of the top surface 401 of the adhesive layer 4 is substantially equal to the width of the wavelength conversion structure 5, and the width of the bottom surface 402 is substantially equal to the width of the light-transmitting layer 2. The width of the top surface 401 of the adhesive layer 4 is not equal to the width of the bottom surface 402. When the adhesive layer 4 has a smaller thickness, the widths of the top surface and bottom surface of the adhesive layer have less difference or are similar.

The wavelength conversion structure 5 has a wavelength conversion layer 501, a first barrier layer 502, a second barrier layer 503, and a third barrier layer 504. The first barrier layer 502 and the second barrier layer 503 can seal the top and bottom surfaces of the wavelength conversion layer 501, and the third barrier layer 504 can seal the side surface of the wavelength conversion layer 501. Therefore, the outer surfaces of the wavelength conversion layer 501 are protected by the barrier layers for insulating from the water and oxygen come from outside, so as to improve the reliability of the wavelength conversion layer 501. The first barrier layer 502 directly covers the top surface of the wavelength conversion layer 501, the second barrier layer 503 directly covers the bottom surface of the wavelength conversion layer 501, and the wavelength conversion layer 501 is sandwiched in between the first barrier layer 502 and the second barrier layer 503. The side surfaces of the first barrier layer 502, the wavelength conversion layer 501, and the second barrier layer 503 are substantially coplanar or not coplanar (not shown). The third barrier layer 504 covers the first barrier layer 502, the wavelength conversion layer 501, the side surface of the second barrier layer 503, and the top surface 507 of the first barrier layer 502. Therefore, the wavelength conversion layer 501 is surrounded by the first barrier layer 502, the second barrier layer 503, and the third barrier layer 504. The first barrier layer 502 is located between the wavelength conversion layer 501 and the third barrier layer 504. The second barrier layer 503 directly contacts the top surface 401 of the adhesive layer 4.

The description of the material of the light-emitting unit 1, the light-transmitting layer 2, the reflective layer 3, the adhesive layer 4, the first barrier layer 502, the wavelength conversion layer 501, the second barrier layer 503, and the third barrier layer 504 can be referred to the descriptions of the aforementioned paragraphs of light-emitting device 100 and are not repeated here.

Figure 6B:
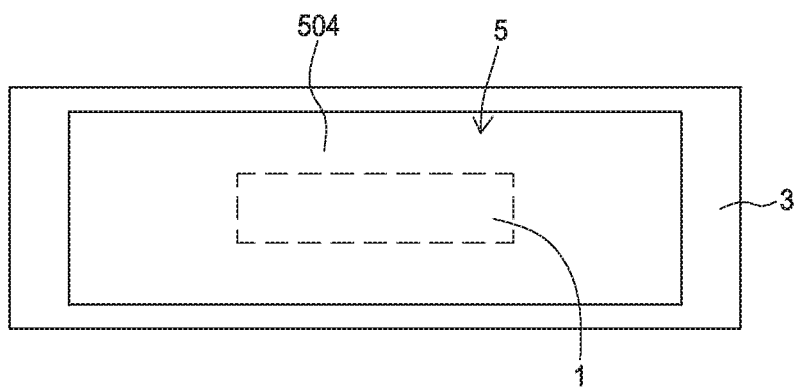
FIG. 6B shows a top view of a light-emitting device in accordance with an embodiment of the present disclosure.

FIG. 6B is a top view of a light-emitting device 300 in accordance with an embodiment of the present disclosure. The wavelength conversion structure 5 covers and locates on the light-emitting unit 1, and the reflective layer 3 surrounds the periphery of wavelength conversion structure 5. In detail, in a top view, the reflective layer 3 surrounds the periphery of the third barrier layer 504, and has a geometric center similar to that of the third barrier layer 504. When the wavelength conversion material in the wavelength conversion structure 5 is excited by the light from the light-emitting unit 1, the thermal energy is also produced by the wavelength conversion material so the temperature of the wavelength conversion structure 5 is increased and the reliability of the wavelength conversion structure 5 is decreased. In one embodiment, the quantum dot particle existed in the wavelength conversion structure 5 can withstand a light energy density of approximately 0.2 W/mm$^2$. If the intensity of the incident light is too strong, the characteristics of the quantum dot particles, such as luminous efficiency and luminous intensity, may be deteriorated. Therefore, in order to reduce thermal energy generated by the wavelength conversion material due to wavelength conversion, the area of the wavelength conversion structure 5 of the light-emitting device 300 is larger than the light-emitting surface of the light-emitting unit 1 for reducing the light energy density the wavelength conversion structure 5 can withstand. From the top view, the top surface of the light-emitting unit 1 has an area A1, and the top surface of the wavelength conversion structure 5 has an area A2, wherein A2>A1, and A2/A1 is in a certain range of values, for example, 1.5<A2/A1<10.

Figure 7A:
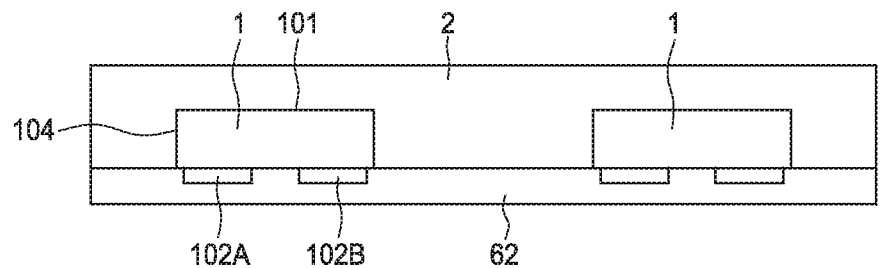
FIGS. 7A~7G show steps of manufacturing a light-emitting device in accordance with an embodiment of the present disclosure.
Figure 7B:
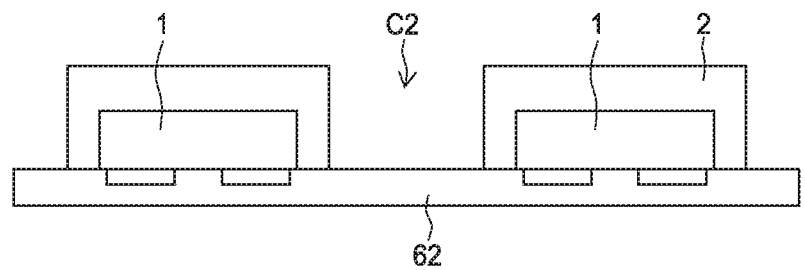
Figure 7C:
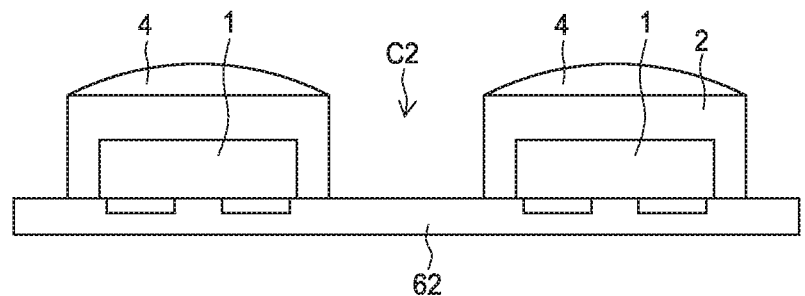
Figure 7D:
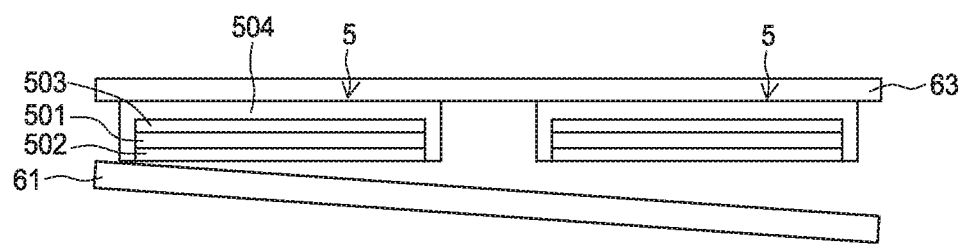
Figure 7E:
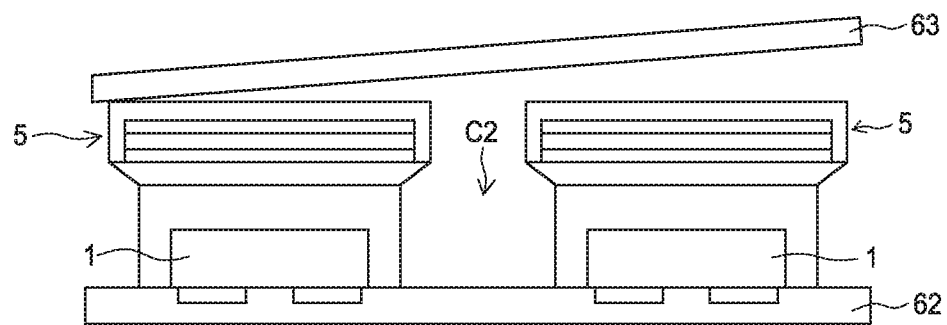
Figure 7F:
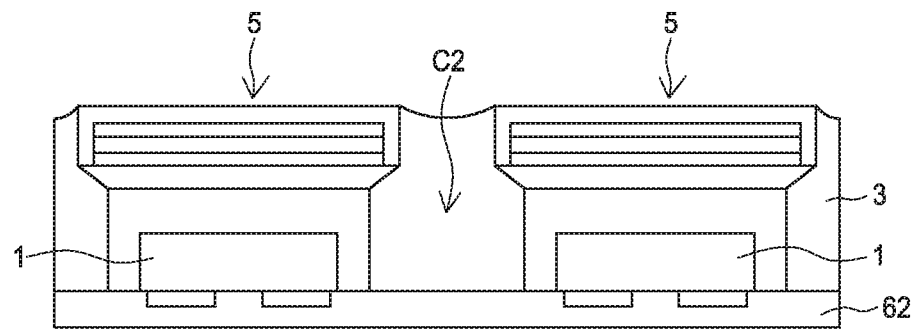
Figure 7G:
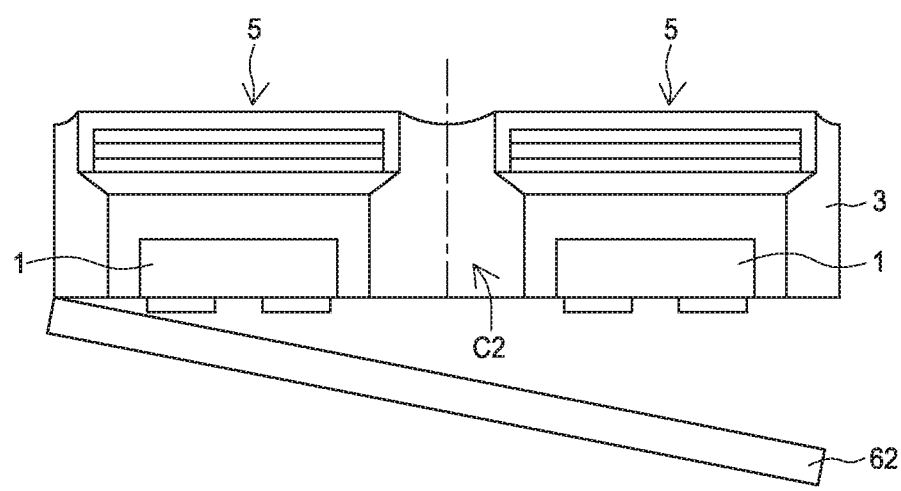

FIGS. 7A~7G show the steps of manufacturing a light-emitting device in accordance with an embodiment of the present disclosure. Referring to FIG. 7A, a second temporary carrier 62 with adhesion is provided, and two conductive electrodes 102A, 102B of the plurality of light-emitting units 1 are disposed on the second temporary carrier 62. The area between adjacent light-emitting units 1 is defined as an aisle. The light-transmitting layer 2 covers the top surface 101 and the side surface 104 of the light-emitting unit 1 and fills in the aisle by printing, coating, spraying, dispensing, or molding. A planarization process, such as a polish process or a blasting process, may be optionally performed to flatten the top surface of the light-transmitting layer 2. Subsequently, referring to FIG. 7B, a portion of the light-transmitting layer 2 located in the aisle is removed by dicing to form a cutting track C2. Referring to FIG. 7C, the adhesive layer 4 is formed above the light-transmitting layer 2. Referring to FIG. 7D, the wavelength conversion structure 5 of FIG. 2D is inverted and disposed on the third temporary carrier 63. Then the first temporary carrier 61 is removed. Subsequently, referring to FIG. 7E, the light-emitting unit 1 is aligned with the structure of FIG. 7D, and the wavelength conversion structure 5 is moved down to adhere to the adhesive layer 4. Hence, the wavelength conversion structure 5 is fixed to corresponding light-emitting units 1 and can cover one or more than one light-emitting unit. Subsequently, the third temporary carrier 63 is removed to expose the cutting track C2. Referring to FIG. 7F, the reflective layer 3 is filled in the cutting track C2 by printing, coating, spraying, dispensing, or molding. Therefore, the reflective layer 3 covers the side surfaces of the wavelength conversion structures 5 and the light-transmitting layer 2. In this step, the filling height of the reflective layer 3 does not exceed the wavelength conversion structure 5, so the polishing process is not needed for exposing the wavelength conversion structure 5. On the other hand, if the filling height of the reflective layer 3 exceeds the wavelength conversion structure 5, the step of reducing the height may be performed as needed so the height of the topmost surface of the reflective layer 3 may exceed the topmost surface of the wavelength conversion structure 5. Finally, referring to FIG. 7G, the reflective layer 3 is diced and the second temporary carrier 62 is removed to form a plurality of light-emitting device. The details of the material and the removing method of the third temporary carrier 63 are the same as those of the first temporary carrier 61 and the second temporary carrier 62, and can be referred to the aforementioned related paragraphs.

Figure 8A:
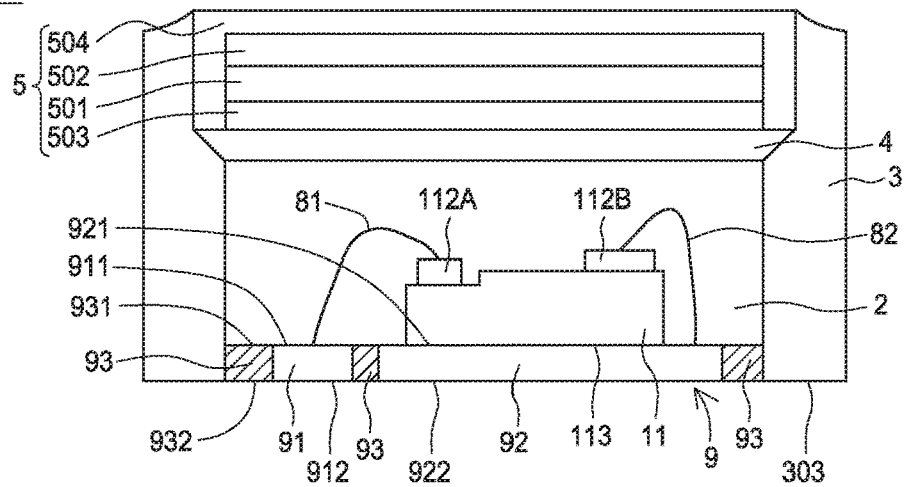
FIG. 8A~8C show cross-sectional views of a light-emitting device in accordance with an embodiment of the present disclosure.
Figure 8B:
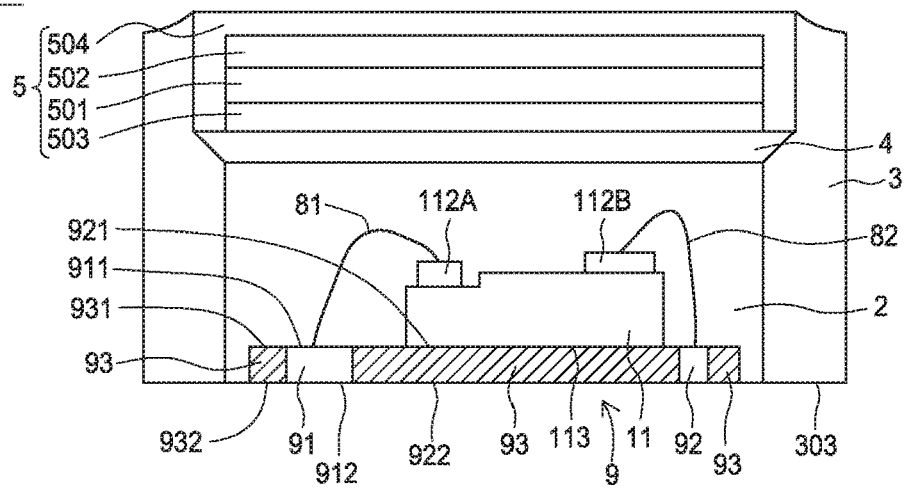
Figure 8C:
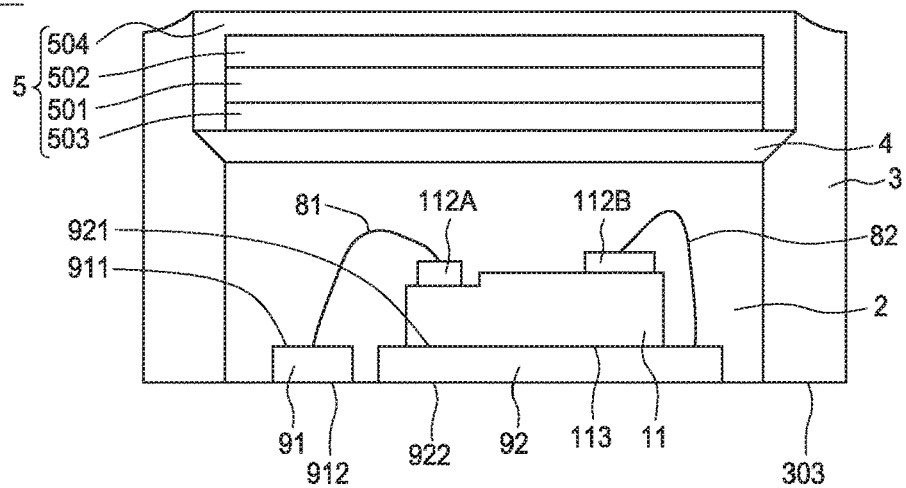

The light-emitting unit 1 of the aforementioned light-emitting devices 100, 110, 200, 300 can be a flip chip. In other words, the two conductive electrodes 102A, 102B of the light-emitting unit 1 are located on the same side of the light-emitting unit 1. In other embodiments, the light-emitting unit 1 can be replaced with a face-up chip as shown in FIGS. 8A~8C. FIG. 8A is a cross-sectional view of a light-emitting device 400 in accordance with an embodiment of the present disclosure. The details of structures and materials of the reflective layer 3, the light-transmitting layer 2, the wavelength conversion structure 5, and the adhesive layer 4 of the light-emitting device 400 are the same as those of the light-emitting device 300, and can be referred to the aforementioned related paragraphs. The light-emitting unit 1 of the light-emitting device 300 is replaced with the light-emitting unit 11 and a sub-mount 9 so as to form the light-emitting device 400. The light-emitting unit 11 is disposed on the sub-mount 9. The sub-mount 9 includes a first conductive portion 91 and a second conductive portion 92 which are physically separated, and an insulating portion 93 surrounding and connecting the first conductive portion 91 and the second conductive portion 92. In an across-sectional view, the width of the second conductive portion 92 is wider than that of the first conductive portion 91. In a bottom view (not shown), the insulating portion 93 surrounds the side surfaces of the first conductive portion 91 and the second conductive portion 92 and optionally forms a flat plane on the top and bottom surfaces of the first conductive portion 91 and the second conductive portion 92. In detail, the top surface 911 of the first conductive portion 91 and the top surface 921 of the second conductive portion 92 are not covered by the insulating portion 93 and are coplanar with the top surface 931 of the insulating portion 93. The bottom surface 912 of the first conductive portion 91 and the bottom surface 922 of the second conductive portion 92 are not covered by the insulating portion 93 and are coplanar with the bottom surface 932 of the insulating portion 93. The bottom surface 113 of the light emitting unit 11 is fixed to the second conductive portion 92 of the sub-mount 9 by an adhesive layer, which is not shown and can be a silver glue, silicone resin, or epoxy resin. The width of the light-emitting unit 11 is smaller than that of the second conductive portion 92. The light-emitting unit 11 has a first conductive electrode 112A and the second conductive electrode 112B which are disposed on the top surface opposite to the bottom surface 113. The first conductive electrode 112A is electrically connected to the first conductive portion 91 by a conductive wire 81, and the second conductive electrode 112B is electrically connected to the second conductive portion 92 by a conductive wire 82. The light-transmitting layer 2 surrounds and covers the light-emitting unit 11, the first conductive electrode 112A, the second conductive electrode 112B, and the conductive wires 81, 82. The reflective layer 3 is directly in contact with the outermost side of the sub-mount 9. In other words, the reflective layer 3 is directly in contact with the insulating portion 93 of the sub-mount 9. The bottommost surface 303 of the reflective layer 3 is coplanar with the bottom surface 912 of the first conductive portion 91, the bottom surface 922 of the second conductive portion 92, and the bottom surface 932 of the insulating portion 93. The external power can be provided to the light-emitting unit 11 through the first conductive portion 91 and the second conductive portion 92 to turn on the light-emitting unit 11. In another embodiment (not shown), the reflective layer 3 is not directly in contact with the outermost side of the sub-mount 9. In other words, the light-transmitting layer 2 directly covers the outermost side of the sub-mount 9.

The material of the first conductive portion 91 and the second conductive portion 92 can be a metal such as Au, Ag, Cu, Cr, Al, Pt, Ni, Ti, Sn, an alloy thereof, or a combination thereof. The material of the insulating portion 93 can be the same as that of the light-transmitting layer 2 for fixing the first conductive portion 91 and the second conductive portion 92. In another embodiment, the material of the insulating portion 93 may be the same as that of the reflective layer 3 to increase the light intensity of the light-emitting device 400.

In another embodiment, the light-emitting unit 11 is disposed on the insulating layer of the sub-mount 9 as shown in FIG. 8B. FIG. 8B is a cross-sectional view of a light-emitting device 410 in accordance with an embodiment of the present disclosure. The structure of the light-emitting device 410 is similar to that of the light-emitting device 400, but the structure of the sub-mount 9 is different from that of the light-emitting device 400. The details of the structures and materials of the light-emitting unit 11, the reflective layer 3, the light-transmitting layer 2, the wavelength conversion structure 5, and the adhesive layer 4 of the light-emitting device 410 are the same as those of the light-emitting device 400 and can be referred to the aforementioned related paragraphs. The sub-mount 9 includes a first conductive portion 91 and a second conductive portion 92 which are physically separated, and insulating portion 93 surrounding and connecting the first conductive portion 91 and the second conductive portion 92. The width of the second conductive portion 92 can be the same as or different from the width of the first conductive portion 91. The insulating portion 93 includes a first portion 933 located on an outer side of the sub-mount 9 and surrounding and covering the outer side surfaces of the first conductive portion 91 and the second conductive portion 92. The second portion 934 of the insulating portion 93 is located between the first conductive portion 91 and the second conductive portion 92 and covers the inner side surfaces of the first conductive portion 91 and the second conductive portion 92. The insulating portion 93 form a common flat plane with the top and bottom surfaces of the first conductive portion 91 and the second conductive portion 92. The light-emitting unit 11 is located between the first conductive portion 91 and the second conductive portion 92, and the bottom surface 113 of the light-emitting unit 11 is fixed to the second portion of the insulating portion 93 through an adhesive layer (not shown). The reflective layer 3 is not directly in contact with the first portion of the insulating portion 93, and the light-transmitting layer 2 is located between the first portion of the insulating portion 93 and the reflective layer 3. The bottom surfaces of the reflective layer 3, the light-transmitting layer 2, and the sub-mount 9 are coplanar. In another embodiment, the reflective layer 3 is directly in contact with the first portion of the insulating layer 93.

In another embodiment, the first conductive portion 91 and the second conductive portion 92 are surrounded and fixed by the light-transmitting layer 2. As shown in FIG. 8C, a cross-sectional view of a light-emitting device 420 in accordance with an embodiment of the present disclosure is disclosed. The details of the structures and materials of the light-emitting unit 11, the reflective layer 3, the light-transmitting layer 2, the wavelength conversion structure 5, and the adhesive layer 4 of the light-emitting device 420 are the same as those of the light-emitting device 400 and can be referred to the aforementioned related paragraphs. The bottom surface 113 of the light-emitting unit 11 is fixed to the second conductive portion 92 through an adhesive layer (not shown). The width of the light-emitting unit 11 is smaller than that of the second conductive portion 92. The first conductive portion 91 is physically separated from the second conductive portion 92, and the width of the second conductive portion 92 is wider than that of the first conductive portion 91. The light-transmitting layer 2 surrounds the side surfaces and the top surfaces of the first conductive portion 91 and the second conductive portion 92 for fixing and supporting the first conductive portion 91 and the second conductive portion 92. In detail, the light-transmitting layer 2 covers the first conductive portion 91, the second conductive portion 92, the light-emitting unit 11, and the conductive wires 81, 82. The reflective layer 3 is not directly in contact with the first conductive portion 91 and the second conductive portion 92. The light-transmitting layer 2 is located between the reflective layer 3 and the first conductive portion 91 and the second conductive portion 92.

In other embodiments, the light-emitting unit 1 of the light-emitting device 100, 110, and 200 can be replaced with the light-emitting unit 11, the sub-mount 9, the first conductive portion 91, and the second conductive portion 92 of FIGS. 8A~8C.

Figure 9A:
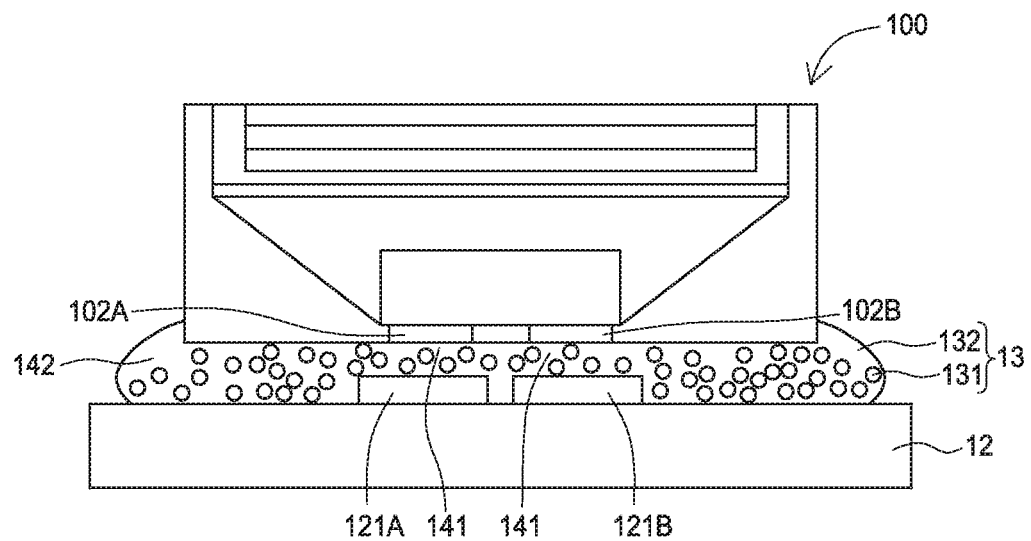
FIGS. 9A~9B show steps of bonding the light-emitting device and the circuit board in accordance with an embodiment of the present disclosure.
Figure 9B:
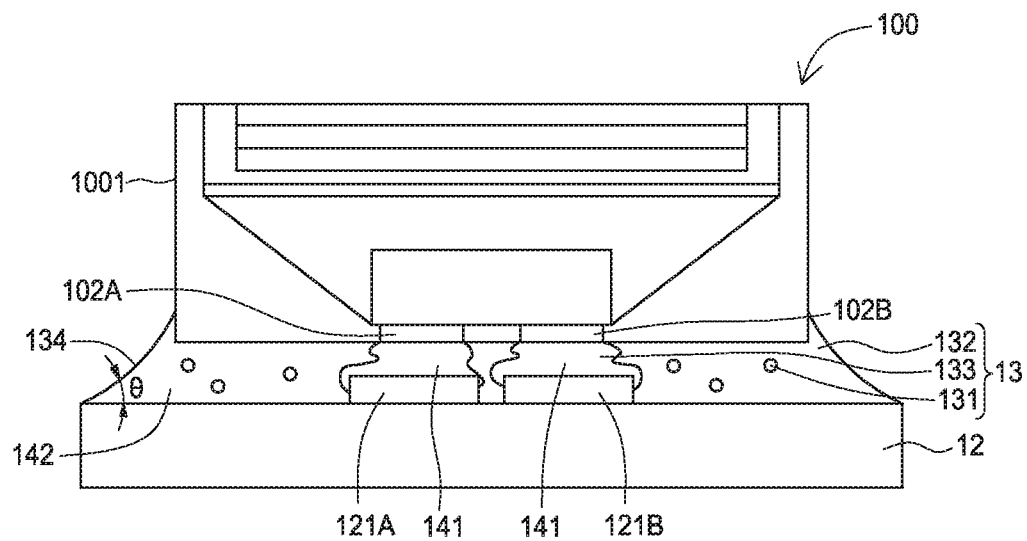

FIGS. 9A~9B show steps of bonding a light-emitting device to a circuit board in accordance with an embodiment of the present disclosure. Referring to FIG. 9A, the light-emitting device 100 is taken as an example. In other embodiments, the light-emitting device can be the light-emitting devices 110, 200, 300, 400, 410, 420. The first conductive electrode 102A and the second conductive electrode 102B face the bonding pads 121A, 121B on the circuit board 12, respectively. The paste 13 is formed between the light-emitting device 100 and the circuit board 12. Referring to FIG. 9A, before thermal curing, the paste 13 includes an insulating material 132 and a plurality of conductive particles 131 dispersed in the insulating material 132. The method of bonding the light-emitting device 100 includes a thermal curing step. During the curing process, the temperature is not over 170° C., the viscosity of the insulating material 132 is first decreased and then raised, and the conductive particles 16052 are gathered in a region which is between or around the first conductive electrode 102A and the bonding pad 121A and between or around the second conductive electrode 102B and the bonding pad 122B. FIG. 9B shows the state after thermal curing. The area covered by the paste 13 includes a conductive region 11 and a non-conductive region 142. The conductive region 141 is located between the first conductive electrode 102A and the bonding pad 121A, and between the second conductive electrode 102B and the bonding pad 121B. Except the conductive region 141, the other region covered by the paste is the non-conductive region 142. As shown in FIG. 9A, before the thermal curing step, the average density of the conductive particles 131 in the conductive region 141 is similar to that in the non-conductive region 142. As shown in FIG. 9B, after the thermal curing step, most of the conductive particles 131 are concentrated in the conductive region 141. The average density of the conductive particles 131 in the conductive region 141 is larger than that in the non-conductive region 142. In an embodiment, the conductive particles 131 in the conductive region 141 have an average density larger than 75%, or the conductive regions 141 preferably without having the insulating material 132. The average density of conductive particles 131 in non-conducting region 142 is less than 40%, but not equal to zero. In other words, the non-conduction region 142 contains a small amount of conductive particles 131 that are separated from each other. For example, the average density of the conductive particles 131 in the non-conduction region 142 is between 0.1% and 40%, preferably between 2% and 10%. The average density of the insulating material 132 in the non-conducting region 142 is larger than 60%, preferably between 60% and 99.9%, and more preferably between 90% and 98%. In one embodiment, the non-conducting region 142 includes the conductive particles 131 with the average density of 10%~40% and the insulating material 132 with the average density of 60%~90%, and preferably the conductive particles 131 with the average density of 20%~30% and the insulating material 132 with the average density of 70%~80%. In another embodiment, the non-conducting region 142 does not include conductive particles 131.

The paste 13 can be divided into a plurality of sub-portions (for example, 3 to 10 sub-portions). The average density is defined as the average of the density of all or selected sub-portions. The size of the sub-portion can be adjusted depending on the size of the test sample or measurement method. For example, the sub-portion has a three-dimensional shape or has a two-dimensional shape in a cross-sectional view. The two-dimensional shape may be an octagon, a hexagon, a rectangle, a triangle, a circle, an ellipse, or a combination thereof. The three-dimensional shape can be a cylinder, a cube, a cuboid, or a sphere. The density of the conductive particles 131 is measured by calculating the number or occupation area observed from a selected view of all the conductive particles 131 in a sub-portion (for example, 20×20 μm$^2$).

The conductive particles 131 can include a metal with a low melting temperature or an alloy with low liquidus melting temperature and have a melting temperature or liquidus melting temperature of less than 210° C. The metal can be an element, a compound, or an alloy, such as Bi, Sn, Ag, In, or an alloy thereof. In one embodiment, the melting temperature or liquidus melting temperature of the metal or the alloy is less than 170° C. The material of the alloy with the low liquidus melting temperature can be a Sn—In alloy or a Sn—Bi alloy. The insulating material 132 can be a thermosetting polymer such as epoxy, silicone, polymethyl methacrylate, and episulfide. The insulating material 132 can be cured at a curing temperature. In an embodiment, the melting temperature of the conductive particles 131 is lower than the curing temperature of the insulating material 132. As shown in FIG. 9A, before the thermal curing step, the size of the conductive particles 131 is defined as the diameter of the conductive particles 131, which is between 1 μm and 20 μm, for example, 2 μm, 10 μm. The weight percentage ratio of the conductive particles 131 to the paste 13 is between 30% and 80%. In one embodiment, when the average size of the conductive particles 131 is approximately 2 μm, the weight percentage ratio of the conductive particles 131 to the paste 13 is between 30% and 70%. In another embodiment, when the average size of the conductive particles 131 is approximately 10 μm, the weight percentage ratio of the conductive particles 131 to the paste 13 is between 40% and 80%. The shortest distance between the first conductive electrode 120A and the second conductive electrode 102B is preferably more than twice the particle size of the conductive particles 131.

In an embodiment, the insulating material 132 is pervious to light. In another embodiment, the insulating material 132 can optionally include a light-absorbing substance to make the insulating material shown as dark color, such as black, for increasing the contrast of the display when the light-emitting device is applied to a display. In another embodiment, the insulating material 132 can optionally include a high reflectivity material to make the insulating material shown as white color to reflect the light from the light-emitting device and emitted toward the circuit board for increasing the light intensity of the light-emitting device. The light-absorbing substance can be carbon, titanium oxide, or dark pigment.

As shown in FIG. 9B, after thermal curing step, the conductive particles located in the conductive region 141 are aggregated into a bulk and be a conductive structure 133. The conductive structure 133 covers at least one side surfaces of the first conductive electrode 102A, the second conductive electrode 102B, and the bonding pads 121A, 121B. The conductive structures 133 directly connect the first conductive electrode 102A, the second conductive electrode 102B, and the bonding pads 121A, 121B respectively to provide electrical conduction. The external power can drive the light-emitting device 1600 through the bonding pads 121A, 121B, the conductive structure 133, the first conductive electrode 102A, and the second conductive electrode 102B. The insulating material 132 surrounds the outer surfaces of the conductive structure 133, the first conductive electrode 102A, the second conductive electrode 102B, and the bonding pads 121A, 121B. The conductive particles 131 in the non-conductive region 142 are distributed discretely and covered by the insulating material 132. Therefore, the conducting current cannot pass through the non-conductive region 142. The insulating material 132 filled in the non-conductive region 142 can enhance the bonding strength between the light-emitting device 100 and the circuit board 12, can avoid the conductive material from oxidation caused by exposing to the external environment, and also can prevent the conductive structure 133 from softening or melting due to high temperature environment that may cause a short circuit problem. In a cross-sectional view, taking the corresponding first conductive electrode 102A and the bonding pad 121A as an example, the bottom end of the conductive structure 133 (the end contacting the bonding pad 121A) completely covers the top surface of the bonding pad 121A, and the top end of the conductive structure 133 (the end contacting the first conductive electrode 1601) completely covers the bottom surface of the first conductive electrode 102A. The conductive structure 133 has a necking shape, and the outer side surface of the conductive structure 133 has a surface of with a concave portion and a convex portion. In another embodiment, the outer side surface of the conductive structure 133 is a convex arc shape, and the conductive structure 133 does not have the neck structure. In another embodiment, the outer side surface of the conductive structure 133 is a flat surface.

As shown in FIG. 9B, the outermost surface 134 of the paste 13 has a curved shape and extends from the circuit board 12 to the outer side surface 1001 of the light-emitting device 100. The shape of the paste 13 is changed after thermal curing step (compared to FIG. 9A), that is, the paste 13 has a different shape between before and after the thermal curing step. The paste 13 covers a portion of the outer side surface 1001 of the light-emitting device 100. More specifically, after thermal curing step, as shown in FIG. 9B, the outermost surface 134 of the paste 13 has an angle θ with respect to the circuit board 12, and the angle θ gradually increases along the direction of the outermost surface 134 toward the outer side surface 1001 of the light-emitting device 100.

Figure 9C:
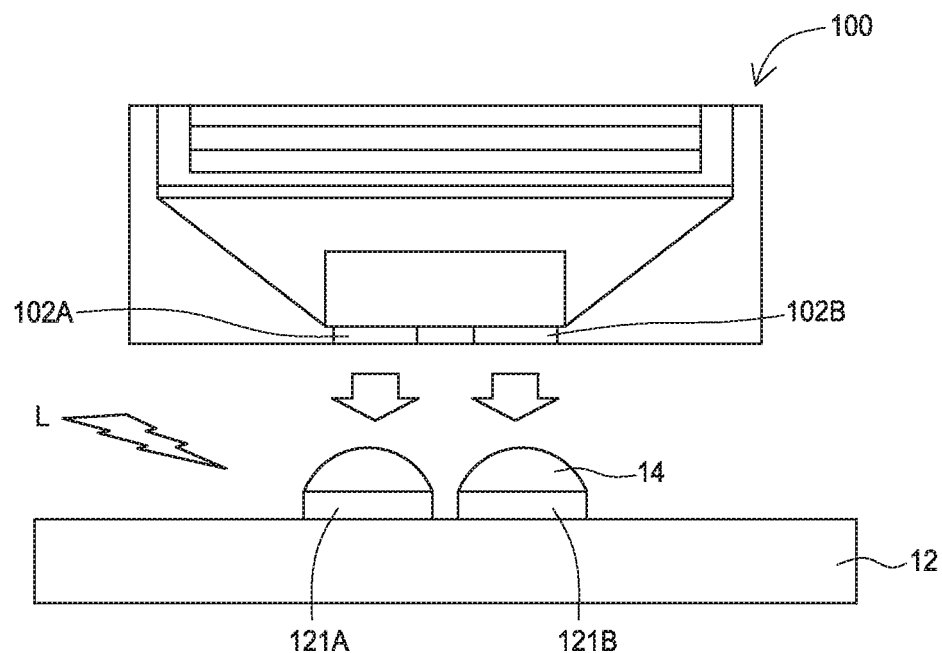
FIGS. 9C~9D show steps of bonding the light-emitting device and the circuit board in accordance with another embodiment of the present disclosure.
Figure 9D:
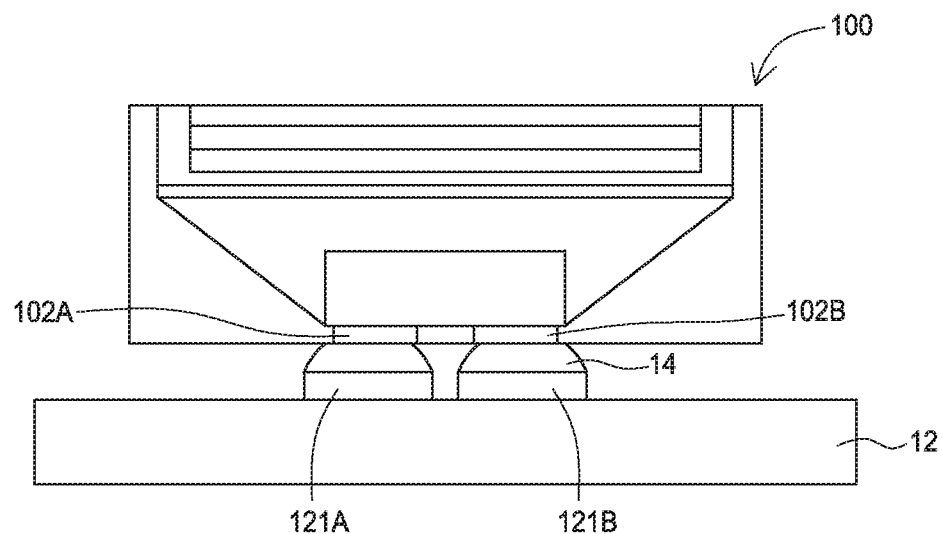

FIGS. 9C~9D show steps of bonding a light-emitting device to a circuit board 12 in accordance with an embodiment of the present disclosure. Referring to FIG. 9C, the light-emitting device 100 is taken as an example. In other embodiments, the light-emitting device can be the light-emitting devices 110, 200, 300, 400, 410, 420. The first conductive electrode 102A and the second conductive electrode 102B face the bonding pads 121A, 121B on the circuit board 12, respectively. The soldering material 14 is formed on the bonding pads 121A, 121B. Energy L is supplied in the bonding area and locally heats the soldering material 14. The energy L can be a laser such as infrared light or UV light. Thereafter, referring to FIG. 9D, the light-emitting device 100 is pressed down onto the melted soldering material 14, and the light-emitting device 100 is bonded to the circuit board 12 by the soldering material 14. Because the energy L only locally heats the soldering material 14 without heating the light-emitting device 100, the reliability of the wavelength conversion structure 5 of the light-emitting device 100 is less affected during heating process. The soldering material 14 can be Sn, Cu, Ag, Bi, In, Zn, Ti, or a combination thereof. In another embodiment, the soldering material 14 can be an anisotropic conductive film (ACF) or a paste 13 which is shown in FIG. 9A~9B and has a self-assembly function.

It will be apparent to those having ordinary skill in the art that various modifications and variations can be made to the devices in accordance with the present disclosure without departing from the scope or spirit of the disclosure. In view of the foregoing, it is intended that the present disclosure covers modifications and variations of this disclosure provided they fall within the scope of the following claims and their equivalents.

What is claimed is:

1. A light-emitting device, comprising:
   a light-emitting unit comprising a top surface and a first side surface;
   a light-transmitting layer covering the top surface and the first side surface;
   a wavelength conversion structure disposed on the light-transmitting layer, and comprising a wavelength conversion layer, a first barrier layer disposed on the wavelength conversion layer, a second barrier layer disposed under the wavelength conversion layer, and a third barrier layer; and
   a reflective layer surrounding the light-emitting unit and the wavelength conversion structure;
   wherein the wavelength conversion layer, the first barrier layer, and the second barrier layer have lateral surfaces which are substantially coplanar with each other and covered by the third barrier layer.

2. The light-emitting device according to claim 1, wherein the first barrier layer and the second barrier layer are in direct contact with the wavelength conversion layer.

3. The light-emitting device according to claim 1, wherein the reflective layer has an inner surface which has a first portion covering the light-transmitting layer and inclined with respect to the first side surface.

4. The light-emitting device according to claim 3, wherein the wavelength conversion structure has a topmost surface, the inner surface has a second portion which is perpendicular to the topmost surface.

5. The light-emitting device according to claim 4, wherein the second portion is inclined with the first portion.

6. The light-emitting device according to claim 1, wherein the wavelength conversion structure has a width larger than that of the light-emitting unit.

7. The light-emitting device according to claim 1, wherein an area ratio of the wavelength conversion structure to the light-emitting unit is in a range of 1.5~10 in a top view.

8. The light-emitting device according to claim 1, further comprising an adhesive layer located between the wavelength conversion structure and the light-emitting unit.

9. The light-emitting device according to claim 1, wherein the wavelength conversion structure is distant from the top surface of the light-emitting unit by a distance greater than zero.

10. The light-emitting device according to claim 1, wherein the wavelength conversion layer comprises a quantum dot material.

11. A light-emitting device, comprising:
    a light-emitting unit comprising a top surface and a first side surface;
    a light-transmitting layer covering the top surface and the first side surface;
    a wavelength conversion structure disposed on the light-transmitting layer, and comprising a wavelength conversion layer, a first barrier layer disposed on the wavelength conversion layer, a second barrier layer disposed under the wavelength conversion layer, and a third barrier layer;
    an adhesive layer located between the wavelength conversion structure and the light-emitting unit; and
    a reflective layer surrounding the light-emitting unit and the wavelength conversion structure, wherein the wavelength conversion layer, the first barrier layer, and the second barrier layer have side surfaces which are covered by the third barrier.

12. The light-emitting device according to claim 11, wherein the first barrier layer and the second barrier layer are in direct contact with the wavelength conversion layer.

13. The light-emitting device according to claim 11, wherein the reflective layer has an inner surface which has a first portion covering the light-transmitting layer and inclined with respect to the first side surface.

14. The light-emitting device according to claim 13, wherein the wavelength conversion structure has a topmost surface, the inner surface has a second portion which is perpendicular to the topmost surface.

15. The light-emitting device according to claim 14, wherein the second portion is inclined with the first portion.

16. The light-emitting device according to claim 11, wherein the wavelength conversion structure has a width larger than that of the light-emitting unit.

17. The light-emitting device according to claim 11, wherein an area ratio of the wavelength conversion structure to the light-emitting unit is in a range of 1.5~10 in a top view.

18. The light-emitting device according to claim 11, wherein the wavelength conversion structure is distant from the top surface of the light-emitting unit by a distance greater than zero.

19. The light-emitting device according to claim 11, wherein the wavelength conversion layer comprises a quantum dot material.

* * * * *